United States Patent
Long et al.

(10) Patent No.: US 11,423,329 B2
(45) Date of Patent: Aug. 23, 2022

(54) SENSING SYSTEMS

(71) Applicant: Digimarc Corporation, Beaverton, OR (US)

(72) Inventors: Scott M. Long, Portland, OR (US); John D. Lord, West Linn, OR (US)

(73) Assignee: Digimarc Corporation, Beaverton, OR (US)

(*) Notice: Subject to any disclaimer, the term of this patent is extended or adjusted under 35 U.S.C. 154(b) by 581 days.

(21) Appl. No.: 16/247,097

(22) Filed: Jan. 14, 2019

(65) Prior Publication Data

US 2019/0213497 A1  Jul. 11, 2019

Related U.S. Application Data

(63) Continuation of application No. 15/149,477, filed on May 9, 2016, now Pat. No. 10,180,339.

(Continued)

(51) Int. Cl.

| | |
|---|---|
| *G06N 20/00* | (2019.01) |
| *G11C 7/10* | (2006.01) |
| *H04L 67/125* | (2022.01) |
| *G06N 3/08* | (2006.01) |
| *G06N 20/10* | (2019.01) |
| *G11C 19/00* | (2006.01) |

(Continued)

(52) U.S. Cl.
CPC ............ *G06N 20/00* (2019.01); *G06N 3/08* (2013.01); *G06N 20/10* (2019.01); *G11C 7/1006* (2013.01); *H04L 67/125* (2013.01); *G06N 3/049* (2013.01); *G06N 3/0454* (2013.01); *G06N 3/126* (2013.01); *G06N 7/005* (2013.01); *G11C 19/00* (2013.01); *H04L 67/327* (2013.01)

(58) Field of Classification Search
CPC ..... H04L 67/125; H04L 67/327; G11C 19/00; G11C 7/1006; G11C 5/141
See application file for complete search history.

(56) References Cited

U.S. PATENT DOCUMENTS 6,223,047 B1 * 4/2001 Ericsson ............. H04W 52/028
                                                        455/517
6,628,972 B1 * 9/2003 Lee ................... H04W 52/0229
                                                        455/574

(Continued)

OTHER PUBLICATIONS

Kim et al., 'Energy-Efficient Module Applied with Run Length Coding for Wireless Sensor Networks', 2008, IEEE, 1037-1041 (Year: 2008).*

(Continued)

*Primary Examiner* — Elias Desta
(74) *Attorney, Agent, or Firm* — Digimarc Corporation

(57) ABSTRACT

A system learns to automatically identify, and detect, contextual conditions that may serve as action triggers to help please a user (or avoid annoying a user). Among other features, a simple sensor arrangement is detailed which, in addition to producing a customary stream of high bandwidth sensor data, provides an output of low bandwidth data. This low-bandwidth data serves to identify a particular reference pattern with which the high-bandwidth sensor data is found to correspond. Such a sensor can employ reference patterns discovered through pseudo-random trials. A great number of other advantageous features and arrangements are also detailed.

15 Claims, 16 Drawing Sheets

Related U.S. Application Data

(60) Provisional application No. 62/161,698, filed on May 14, 2015, provisional application No. 62/159,115, filed on May 8, 2015.

(51) Int. Cl.
| | |
|---|---|
| H04L 67/63 | (2022.01) |
| G06N 7/00 | (2006.01) |
| G06N 3/12 | (2006.01) |
| G06N 3/04 | (2006.01) |

(56) References Cited

U.S. PATENT DOCUMENTS

| | | | |
|---|---|---|---|
| 9,448,629 B2* | 9/2016 | Yamane | G06F 3/016 |
| 2007/0037610 A1* | 2/2007 | Logan | H04M 19/04 |
| | | | 455/574 |
| 2007/0127439 A1* | 6/2007 | Stein | H04L 12/2801 |
| | | | 370/352 |
| 2011/0161076 A1 | 6/2011 | Rodriguez | |
| 2011/0212727 A1 | 9/2011 | Li | |
| 2012/0265716 A1 | 10/2012 | Anthony | |
| 2012/0265717 A1 | 10/2012 | Sanjiv et al. | |
| 2012/0279304 A1 | 11/2012 | Lee | |
| 2013/0044233 A1 | 2/2013 | Bai | |
| 2013/0150117 A1 | 6/2013 | Yang | |
| 2013/0179110 A1 | 7/2013 | Lee | |
| 2013/0332108 A1 | 12/2013 | Patel | |
| 2014/0106710 A1 | 4/2014 | Rodriguez | |
| 2014/0244209 A1 | 8/2014 | Karthik | |
| 2014/0357312 A1 | 12/2014 | Rogers | |
| 2015/0127298 A1 | 5/2015 | Karthik | |
| 2016/0055847 A1* | 2/2016 | Dahan | G10L 15/30 |
| | | | 704/275 |
| 2016/0063611 A1 | 3/2016 | Rhoads | |

OTHER PUBLICATIONS

Dot Product article, Wikipedia, Mar. 30, 2015.
Genetic Algorithm article, Wikipedia, Apr. 21, 2015.
Knill, Lecture 12: Correlation, Math 19b: Linear Algebra with Probability, Harvard, 2011.
Machine Learning article, Wikipedia, May 4, 2015.
Matrix Multiplication article, Wikipedia, Apr. 29, 2015.
Shift Register article, Wikipedia, Apr. 3, 2015.
Prosecution excerpts from U.S. Appl. No. 15/149,477.

* cited by examiner

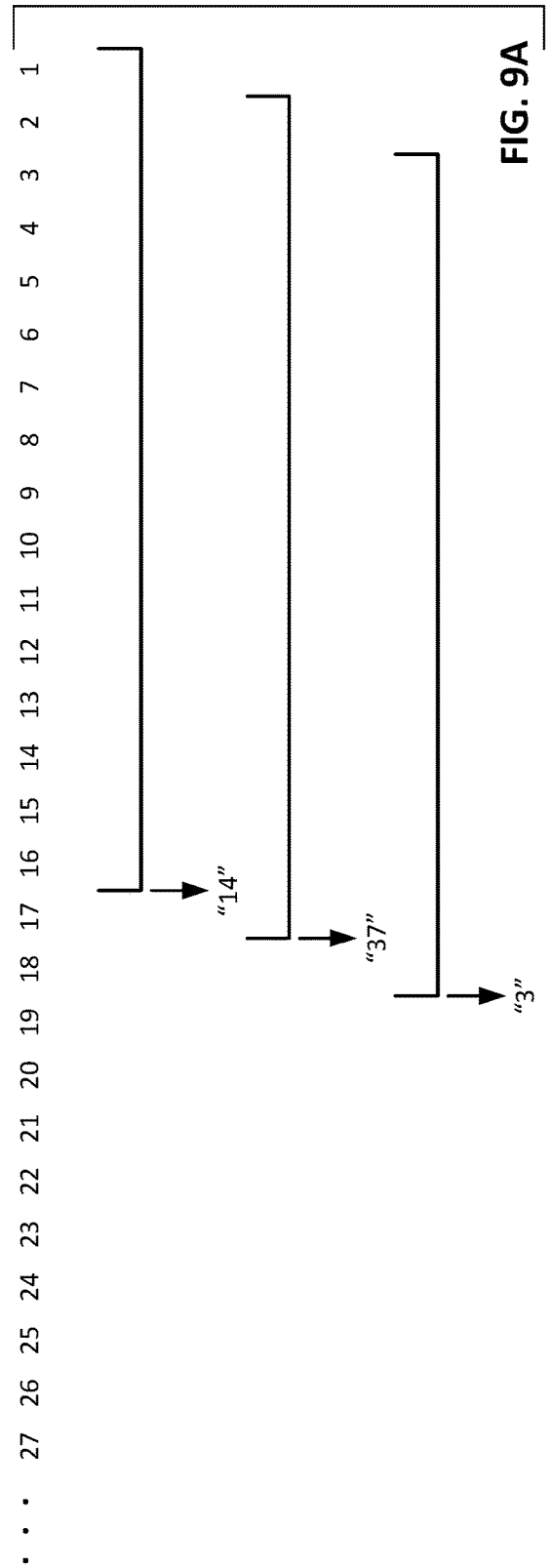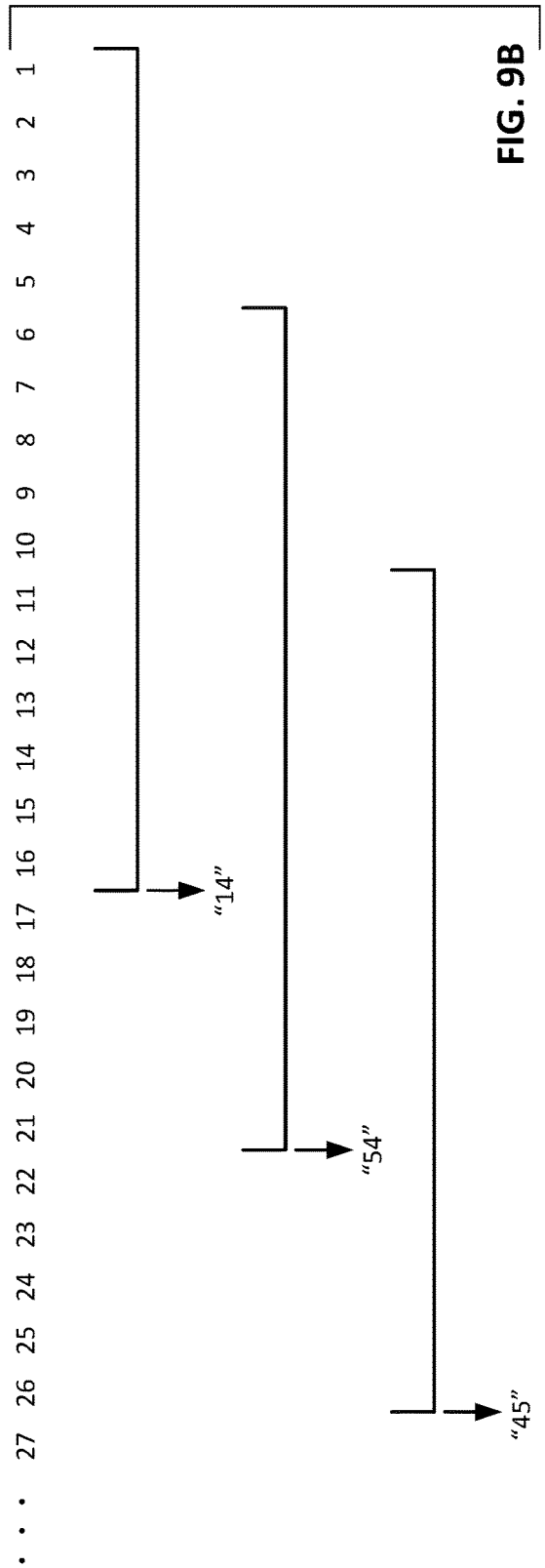

| UID | ROW | COEFFICIENTS |
|---|---|---|
| 9A32E396 | 1 | 60,55,76,10 |
| 9A474737 | 2 | 15,77,36,81 |
| 9A81AB4D | 3 | 89,5,62,25 |
| 9A95826F | 4 | 90,62,17,13 |
| 9AD37DB8 | 5 | 55,14,12,95 |
| F43D5BA2 | 1 | 34,66,59,0,77,20,33,24 |
| F4C1480A | 2 | 99,25,34,75,63,25,97,71 |
| F4A2981A | 3 | 47,59,62,20,81,66,95,1 |
| F45372E0 | 4 | 38,23,4,36,37,5,80,85 |
| F4D6AE82 | 5 | 97,57,48,96,53,6,4,30 |
| F4D48DDA | 6 | 68,86,89,87,62,13,36,18 |
| F4C644B9 | 7 | 63,19,78,29,13,53,92,94 |

SENSING SYSTEMS

RELATED APPLICATION DATA

This application is a continuation of application Ser. No. 15/149,477, filed May 9, 2016 (now U.S. Pat. No. 10,180, 339), which claims priority to provisional applications 62/159,115, filed May 8, 2015, and 62/161,698, filed May 14, 2015. The disclosures of these applications are incorporated herein by reference.

DETAILED DESCRIPTION

The present technology builds on applicant's previous work in the field of intuitive/contextual computing as detailed, e.g., in patent documents 20110212727, 20110161076, 20130044233, 20130150117, 20140106710, 20140357312 and 20160063611. These documents are incorporated by reference herein, as if bodily included.

These and other intuitive/contextual computing systems aim to act, anticipatorily, to fulfill user needs, e.g., sparing the user the need to launch certain desired operations on the user's portable computing device (e.g., smartphone), and/or sparing the user the need to take certain actions in the user's environment (apart from the device). Instead, such actions are instituted automatically, based on sensed context.

Simple examples are already familiar. For example, a user approaches her car, and it unlocks.

A drawback to such prior art systems is that they must be manually scripted. Someone (typically a smartphone app developer) has to identify what context conditions characterize a particular user situation (e.g., the developer must define particular patterns in accelerometer data and GPS data tending to indicate that the user is approaching her car), and what action should be triggered in response (issuing a wireless unlocking signal from the user's smartphone to the car).

Certain aspects of the present technology seek to address some of these problems. The present technology, for instance, may automatically discover that certain patterns of sensor data seem to regularly precede the user unlocking her car. The technology may further discover that if the user's smartphone acts to automatically unlock the car when these patterns are detected, then user satisfaction improves. Such automated discoveries relieve the app developer from the chore of manually defining each context condition, and each response—aiding development of intuitive computing systems.

Other aspects of the present technology concern improved sensors that produce both high- and low-bandwidth output data, wherein the low-bandwidth output data serves to identify a particular pattern with which the high-bandwidth data is found to correspond. Such sensors are simple to implement, inexpensive to produce, and can result in power savings in associated circuitry (which doesn't need to operate at high clock rates to process the low bandwidth data).

The foregoing and other features and advantages of the present technology will be more readily apparent from the detailed description, which proceeds with reference to the accompanying drawings.

BRIEF DESCRIPTION OF THE DRAWINGS

FIGS. 9A and 9B illustrate different output data timings that may be achieved by embodiments according to FIG. 8.

FIG. 12 shows an exemplary organization of a data structure that details correspondence between UIDs, their respective rows, and associated reference vector coefficients.

DETAILED DESCRIPTION

For expository convenience, this specification begins by describing certain non-optimized arrangements, but which help illustrate certain principles underlying aspects of the present technology. Later discussions detail more efficient implementations.

Figure 1:
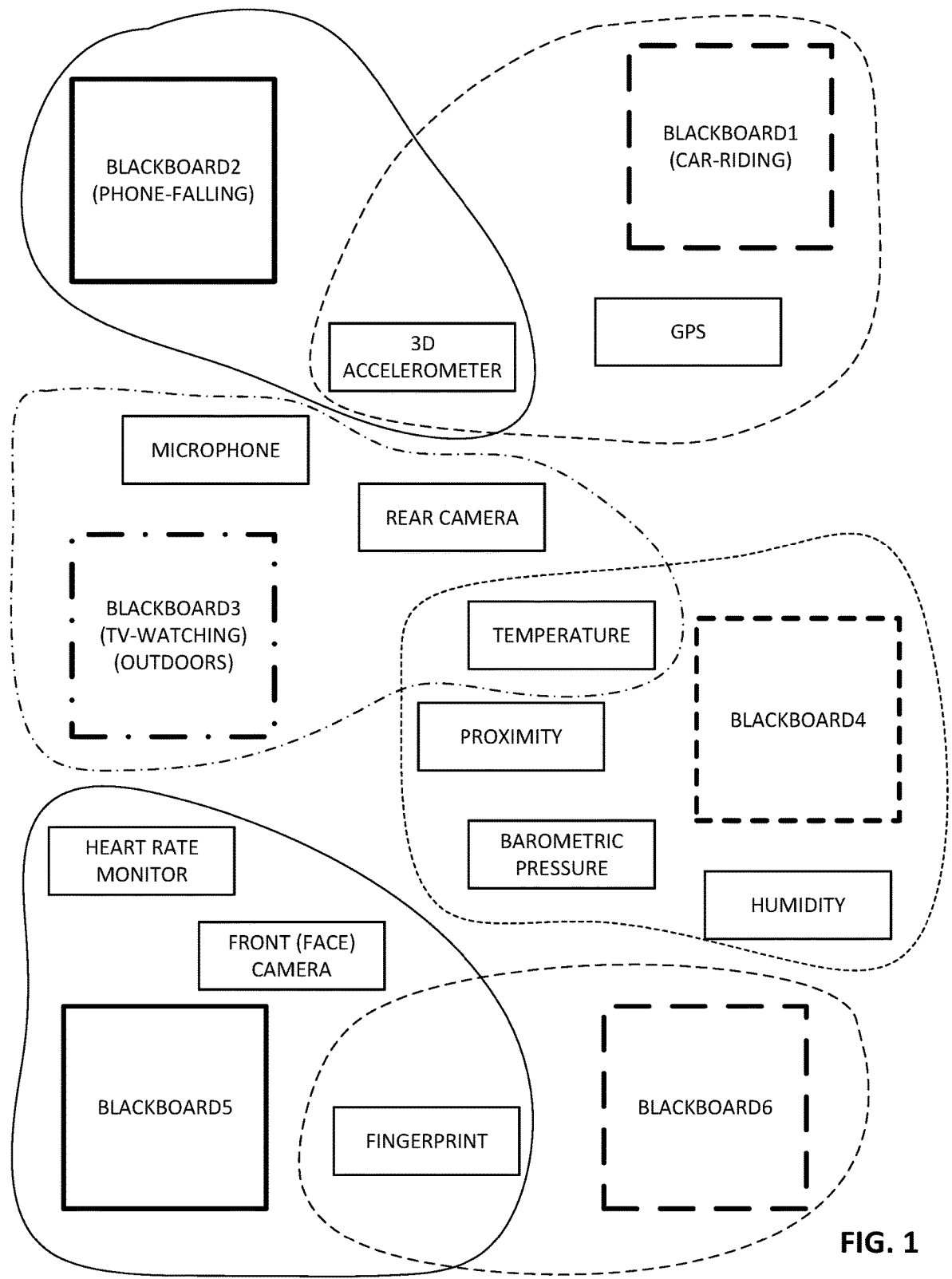
FIG. 1 is a conceptual drawing depicting plural different sensors, and plural associated memories (blackboards).

Turning to FIG. 1, many of the contextual computing embodiments detailed in the above-cited patent documents employ a blackboard data structure to collect and share sensor-related information. FIG. 1 shows plural sensors, writing data to plural blackboards. Some sensor data is written to one blackboard, but other sensor data is written to several blackboards. (A phone may include many sensors other than those indicated. Others include a 3D magnetometer and a 3D gyroscope.)

Some of the sensors may be physical sensors, e.g., thermistors, microphones, MEMs accelerometers, etc.,—many of which produce analog signals, and are thus commonly integrated with associated analog-to-digital converters. Others of the sensors may be logical sensors. Logical sensors typically involve some processing of data from one or more physical sensors, to draw inferences or otherwise yield enhanced information. Many logical sensors retain state. For example, a classifier (a type of logical sensor) typically has been trained, and relies on that knowledge to perform its action. In contrast, physical sensors are generally state-less. It will be recognized that context discovery—as detailed herein—is itself a form of logical sensing.

The assignment of certain sensor data to certain blackboards can tailor different blackboards for certain purposes. Appropriate groupings of sensor data to memories can be determined manually, by an app developer, or, as detailed later, can be discovered automatically.

One purpose may be to detect that the user is riding in a vehicle. To illustrate, a GPS-sensed position that changes at more than 5 mph—but less than 90 mph, is evidence that the user is riding in a vehicle. So is accelerometer data showing patterns of vibrations, bumps, jostles and/or sways, which are consistent with riding in a vehicle on a roadway. Data from a phone's GPS and 3D accelerometer can be collected on a common blackboard (e.g. Blackboard1) and analyzed to reach a conclusion about whether the user is riding in a vehicle.

Another purpose may be to detect that a smartphone (from which sensor data is collected) is falling. This can include accelerometer data showing that the usual acceleration of gravity in the vertical direction suddenly changes to near zero. Thus, a falling-phone blackboard can be established as Blackboard2, and store accelerometer data.

Another purpose may be to detect that a user is outdoors. This may be evidenced by certain ranges of data from a smartphone's camera, microphone, and temperature sensors. A Blackboard3 can serve as a repository for data from these sensors.

Another purpose may be to detect that a user is watching television. This may be evidenced by different ranges of data from the camera, microphone and temperature sensors—already available in Blackboard3.

It will be recognized that each of these examples includes two parts: identification of sensors relevant to the determination, and identification of features (e.g., patterns or values) in the sensor data that tend to indicate a particular context condition. (And, as noted above, there is the further matter of defining what action to initiate in response to a particular context condition.)

User context inferencing, based on sensor data, is never 100% certain; such analyses are naturally probabilistic. For example, a Bayesian hypothesis that the user is riding in a vehicle can be evaluated based on data from Blackboard1. As the data changes, evaluation of the hypothesis changes, e.g., at one time indicating a 23% probability the user is riding in a vehicle, and at another time indicating an 81% probability that the user is riding in a vehicle.

Probabilities are useful in some systems; other systems work best with binary information: the user is riding in a vehicle, or is not. Binary results can be obtained by applying a threshold test to probability information. For example, 85% may be set as a threshold value. If the probability is greater than 85%, then the user is concluded to be riding in a vehicle. Else, the user is concluded to not be riding in a vehicle.

Such binary-outcome systems can be characterized by their false-positive (and/or false-negative) performance. If the probability is 87%, the just-described a binary-outcome system will conclude the user is riding in a vehicle. Sometime such conclusion is wrong. False positive is a measure of how often an assertion is made, and is wrong. (False negative is how often an assertion is not made, when it should have been.) The threshold can be set to minimize a false-positive or false-negative measure.

It will be noted that sensor data on any of Blackboard1 through Blackboard6 of FIG. 1 can be processed to assess whether the user is riding in a vehicle. Most of these assessments are based on data that is essentially irrelevant to this particular task, and yield result data that is predictably unreliable (e.g., a high false positive or false negative test, if binarized by a threshold).

From the foregoing it will be seen that systems can be manually-designed to collect and analyze data from particular groupings of sensors, to determine likelihoods that particular context conditions are met. However, a system designer often cannot foresee all of the context conditions that may be relevant to contextual control of a user's environment. Such hand-tuned, scripted arrangements lack the plasticity that is often desired. Better would be an arrangement that can adapt or learn.

In accordance with one aspect of the present technology, sensor data is collected onto memories (blackboards) in groupings that are not purpose-tailored. To illustrate, a pseudo-random assignment can be used.

Figure 2:
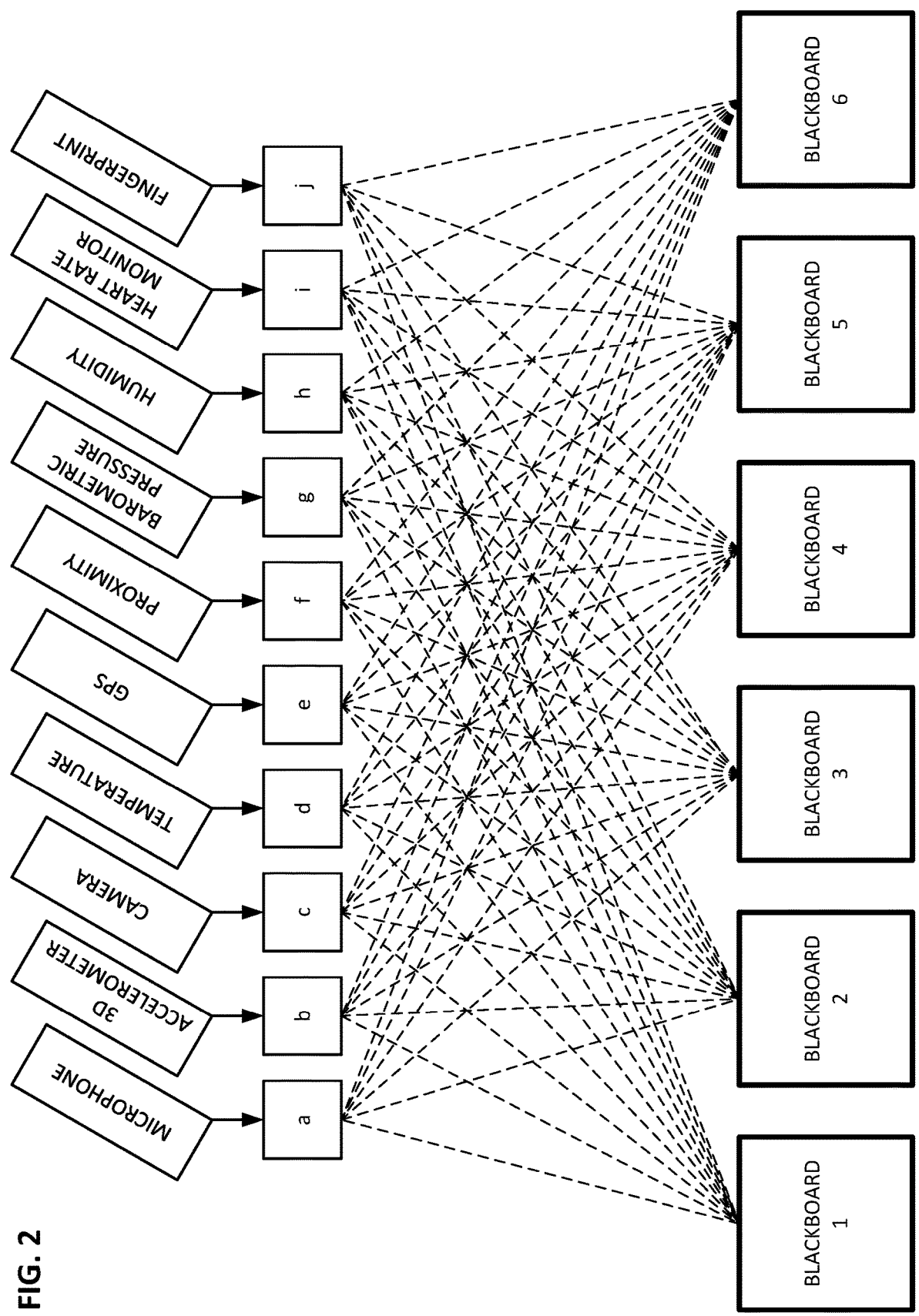
FIG. 2 shows a circuit arrangement by which data from a large number of sensors can be written to a smaller number of memories.

In FIG. 1, there are 10 sensors (20a-20j), and 6 blackboards. Turning to FIG. 2, assume each sensor has an associated logic gate (a-j) that routes its output to between 1 and N of the different blackboards. In this particular implementation, N=7.

Figure 3A:
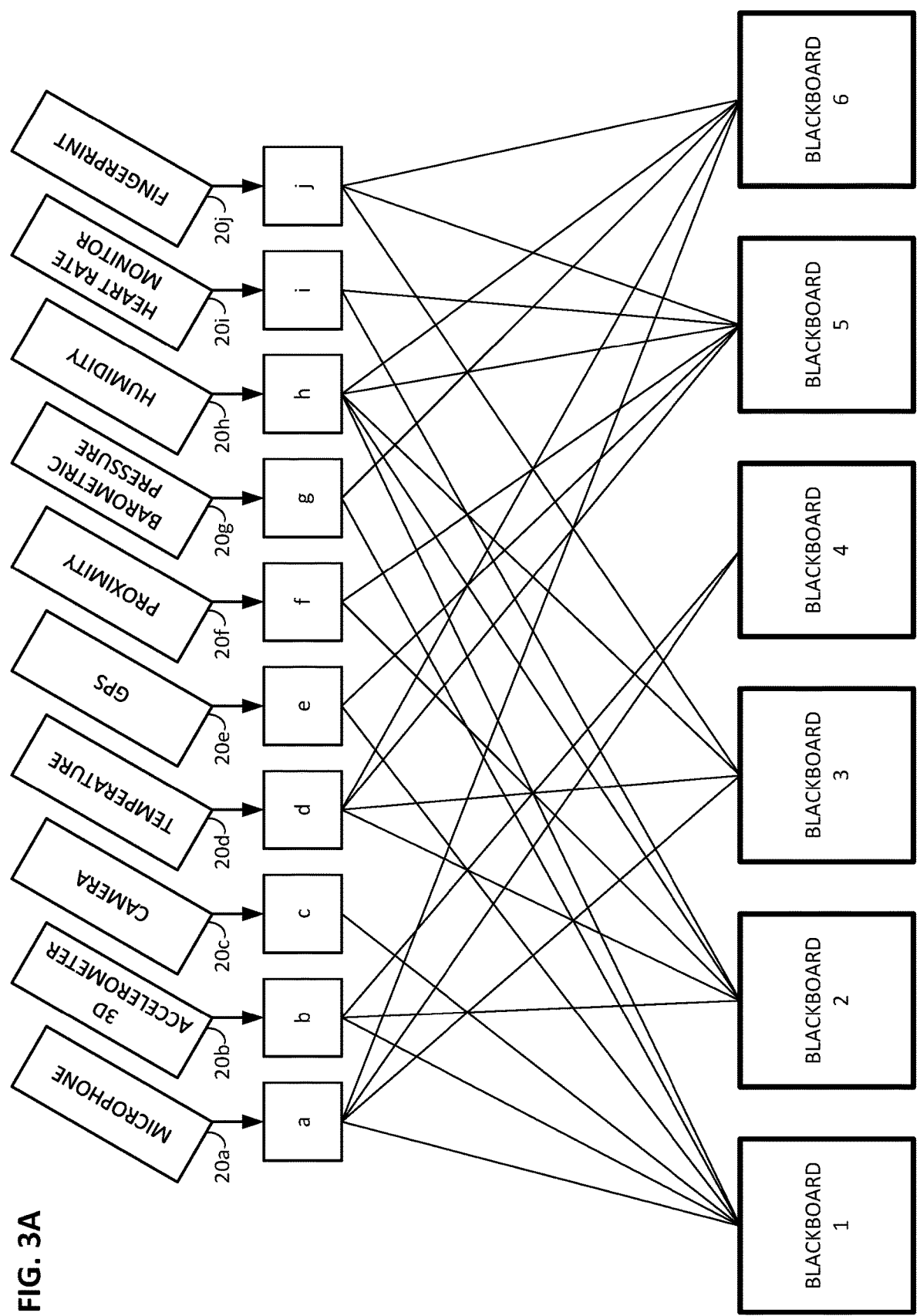
FIGS. 3A, 3B and 3C show certain states of the circuit arrangement of FIG. 2.

FIG. 3A shows one state of this sensor network. In this state, Blackboard1 (hereafter "BB1") collects data from 6 sensors: 20a (a microphone), 20b (an accelerometer), 20c (a camera), 20e (a location sensor—here GPS), 20g (a barometric pressure sensor) and 20h (a humidity sensor). BB2 collects data from 5 sensors (indicated by logic gates b, d, f, h, and i). Similarly for each of the other blackboards.

Figure 3B:
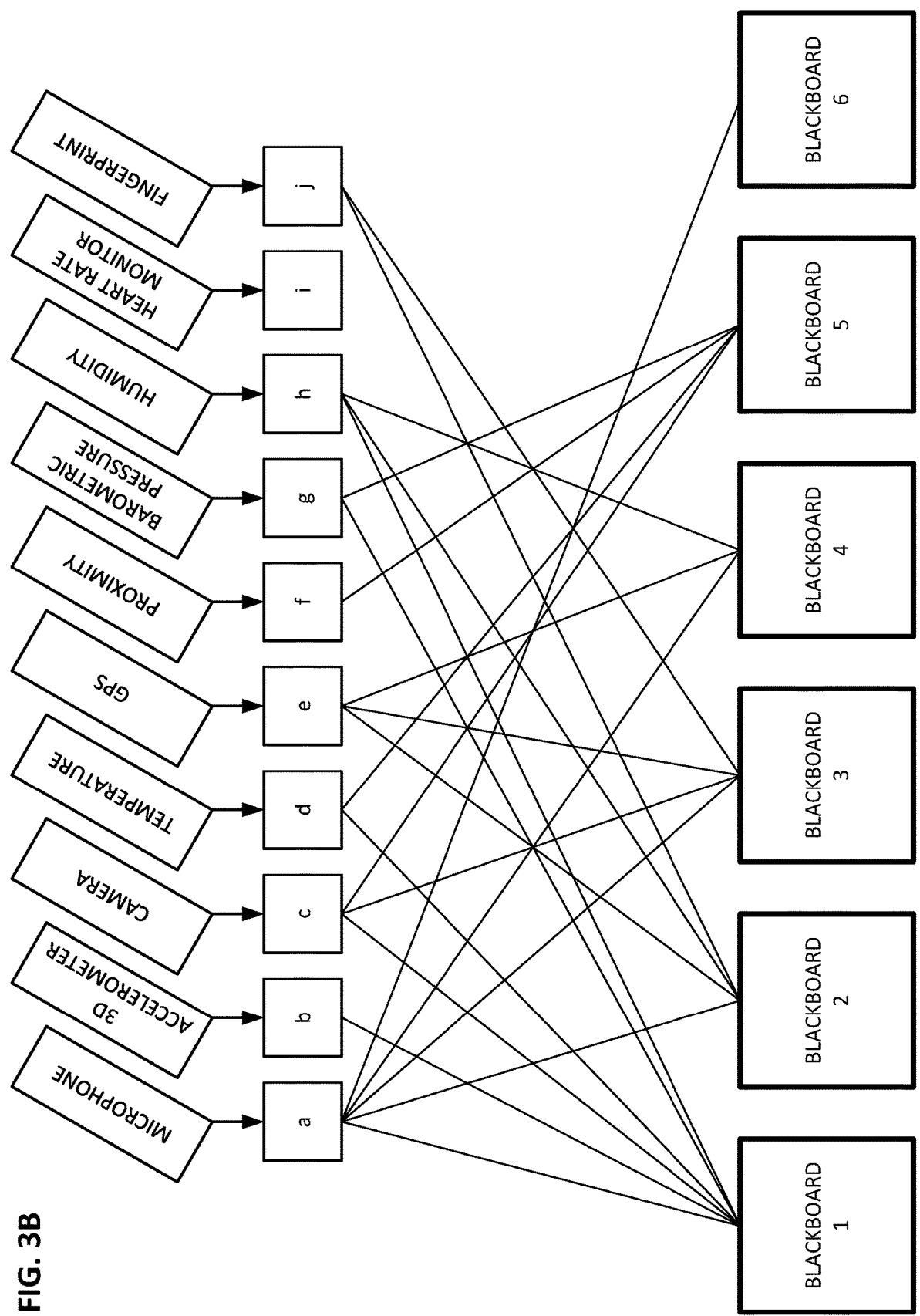

The logic gates (a-j) can be reconfigured to put the sensor network in another state, as shown in FIG. 3B. A further pseudo-random re-arrangement puts the network in the topology shown in FIG. 3C.

Figure 3C:
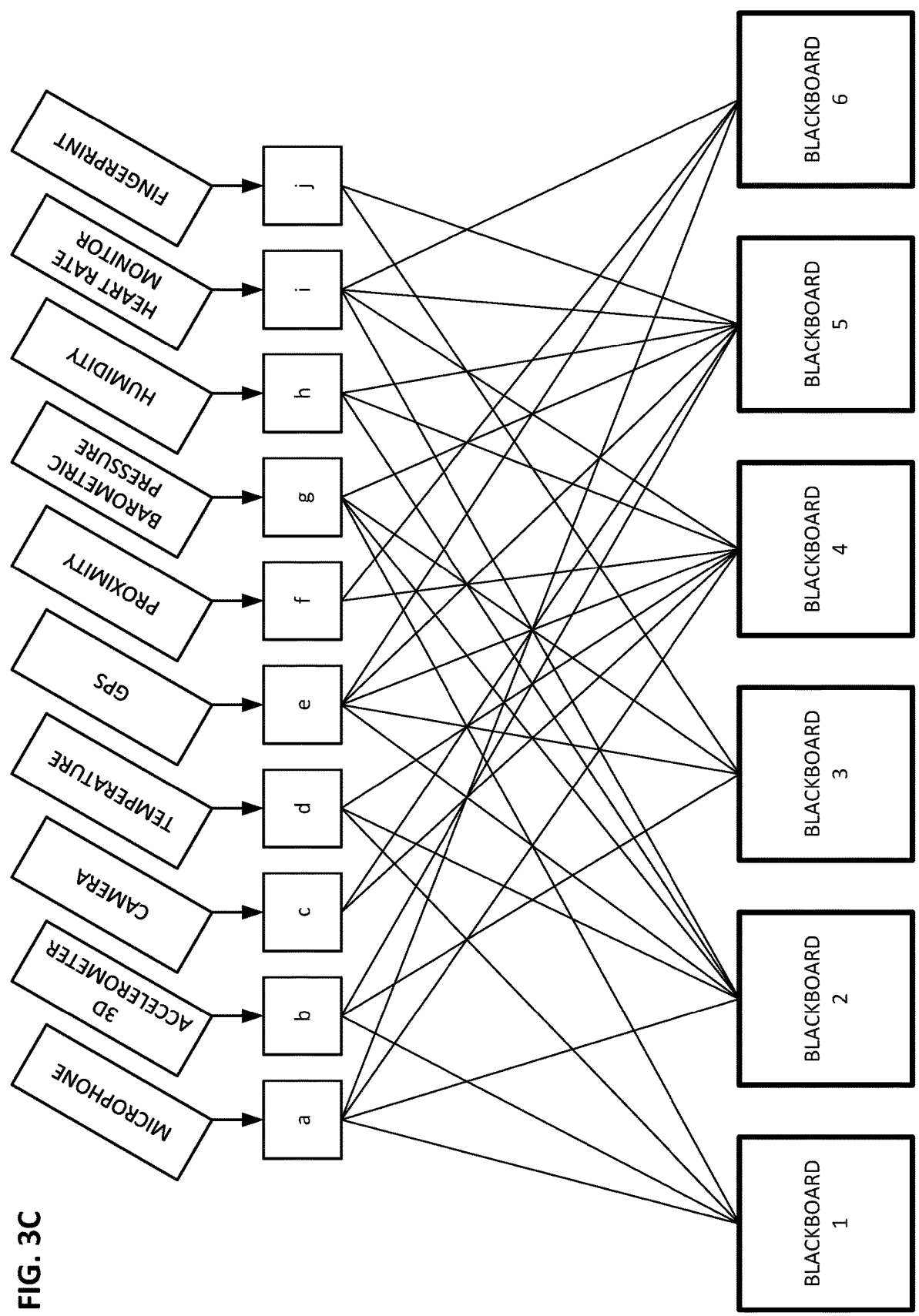

In some states, a blackboard may host data from a single sensor (e.g., BB6 in FIG. 3B), while another blackboard may host data from seven sensors (e.g., BB5 in FIG. 3C). Similarly, data from a particular sensor may be written to none, some, or all of the blackboards, depending on the pseudo-random data that controls the logic gates a-j.

Depending on the vagaries of random processes, two or more blackboards may coincidentally host the same collection of sensor data—either within a particular interconnection topology (e.g., within FIG. 3A), or across blackboards in different configuration states of the network (e.g., a blackboard in FIG. 3A may host data from the same collection of sensors as a blackboard in FIG. 3B). Another result of random assignment may be that a blackboard is assigned no sensor data. The system can check for occurrence of these and other undesirable conditions and—when found—re-randomize the assignment of sensor data to blackboards.

18 blackboards are shown in FIGS. 3A-3C. Which is best suited to discern whether the user is riding in a vehicle? Which is best suited to discern whether the user is watching television?

An answer is to test and discover. For example: change the groupings of sensor data fed to the different blackboards (e.g., by changing the logic gates), and determine which composition of sensor data on a blackboard is most useful in discerning (and, potentially, responding to) a particular context condition. The assignment of data from the various sensors to the various blackboards can be re-shuffled periodically (e.g., every minute, hour, day or week), to discern—over time—which groupings of sensor data on common blackboards best serve different purposes.

Various issues are present. A first is to identify what collection of sensor data is most useful in detecting a particular context condition. A second is to identify what features, or attributes, within that collected group of sensor data, most reliably indicate that particular context condition (i.e., feature selection). The first optimization can be addressed by trialing different collections of sensor data onto a common blackboard and seeing which grouping is most useful. The second optimization can be addressed likewise; creating multiple features from the collected sensor data, and testing the features to determine which are most useful to meet the user's needs.

By way of example, assume that each blackboard maintains a history of the past 60 seconds of data from one or more sensors, as explained above. Each datum is time-stamped, so that data from one sensor can be temporally correlated with data from each other sensor.

Diving now into an especially non-optimized part of this disclosure, consider that each time-sequence of sensor data in a blackboard is processed to generate a hundred or a thousand different features. One feature may be the average of the sensor's output values for the past 5 seconds. A second feature may be similar, but computed for the past 60 seconds. A third feature may be the difference between the first and second features. A fourth feature may be a median of the sensor's output value for the most recent 5 seconds. A fifth may be the median for the past 60 seconds. A sixth may be a difference between the fourth and fifth features. The $7^{th}$ and $8^{th}$ features may be the mode of the sensor's data series over the past 5 and 60 seconds, respectively, with the $9^{th}$ being the difference therebetween. The $10^{th}$ and $11^{th}$ features may be the minimum sensor datum values in the past 5 and 60 seconds, with the $12^{th}$ being the difference therebetween. $13^{th}$-$15^{th}$ may be similar, but based on maximum sensor datum values.

Other features can be based on a histogram analysis of the sensor data. For example, one feature may identify the sensor datum value that falls at the $25^{th}$ percentile of values of those from the past 60 seconds. Other features may be similar, but for the $50^{th}$ and $75^{th}$ percentiles.

The series of sensor data can be transformed into the frequency domain by a 1D FFT, which is performed, e.g., every 5 seconds, based on a window that encompasses the past 30 or 60 seconds of data. One such feature can be the frequency bin with the largest count. Another feature can be the bin frequency that falls at the $25^{th}$ percentile of frequency values. Similarly with the $50^{th}$ and $75^{th}$ percentiles.

Still other features include co-variances and auto-correlations.

The above features are scalar values. Features other than scalars can also be included, such as histograms, vectors, textual metadata (e.g., resulting from processes such as facial recognition), processed image data, etc. Some features involve patterns, e.g., in a sensor's changing output as a function of time or—in the case of imagery—across a field of view. Patterns in transform domains (e.g., resulting from FFT transformation of 1D or 2D data, or from a Fourier-Mellin transform) can also be useful. (Some of the patterns that can be derived from imagery are identified in publication 20110161076 at paragraphs 304-336.)

At the other extreme, certain features can be represented by flag bit data. For example, a bit may be set to "1" if the phone senses a face showing frustration; another bit may be set to "1" if the user's lips become tightened; yet another bit may be set to "1" if the user's nostrils flare momentarily; still another bit may be set to "1" if the user's pulse rises more than 5 beats per second in less than 3 seconds, etc. (These features may have time-stamps associated with them as appropriate.)

Still other features can indicate coincidence, or other time- or phase-based relationships, between different data from different sensors collected in a blackboard, or between features derived from such data. Coincidence here means co-occurrence within a threshold time interval (e.g., 300 ms or 1 second), or within 1 sample period (e.g., if a sample period is more than 300 ms or 1 second).

(The foregoing discussion illustrates one of the advantages of the multiple-blackboard arrangement. It limits the number of hybrid features (i.e., features based on data from more than a single sensor) that are possible. Without narrowing the sources of input data from 10 sensors to a smaller number (e.g., 1-7 in the FIG. 3 examples), a combinatorial explosion of hybrid features can occur—making it more difficult to identify useful features. It is rare for a feature that is based on data from more than three or four different types of sensors to be useful.)

Myriad other features will be apparent to the artisan; the foregoing is just a sampling. (The literature of feature selection and extraction is extensive. Examples include Langley, Selection of Relevant Features in Machine Learning, AAAI Technical Report FS-94-02, 1994; Hall, Correlation-Based Feature Selection for Machine Learning, University of Waikato, April, 1999; Zhao, et al., Advancing Feature Selection Research, ASU Feature Selection Repository, 2010; and the book Feature Extraction, Construction and Selection, Lu et al eds., Springer, 1998. Feature extraction and selection functionality is provided in various popular software packages, including MATLAB.)

Figure 4:
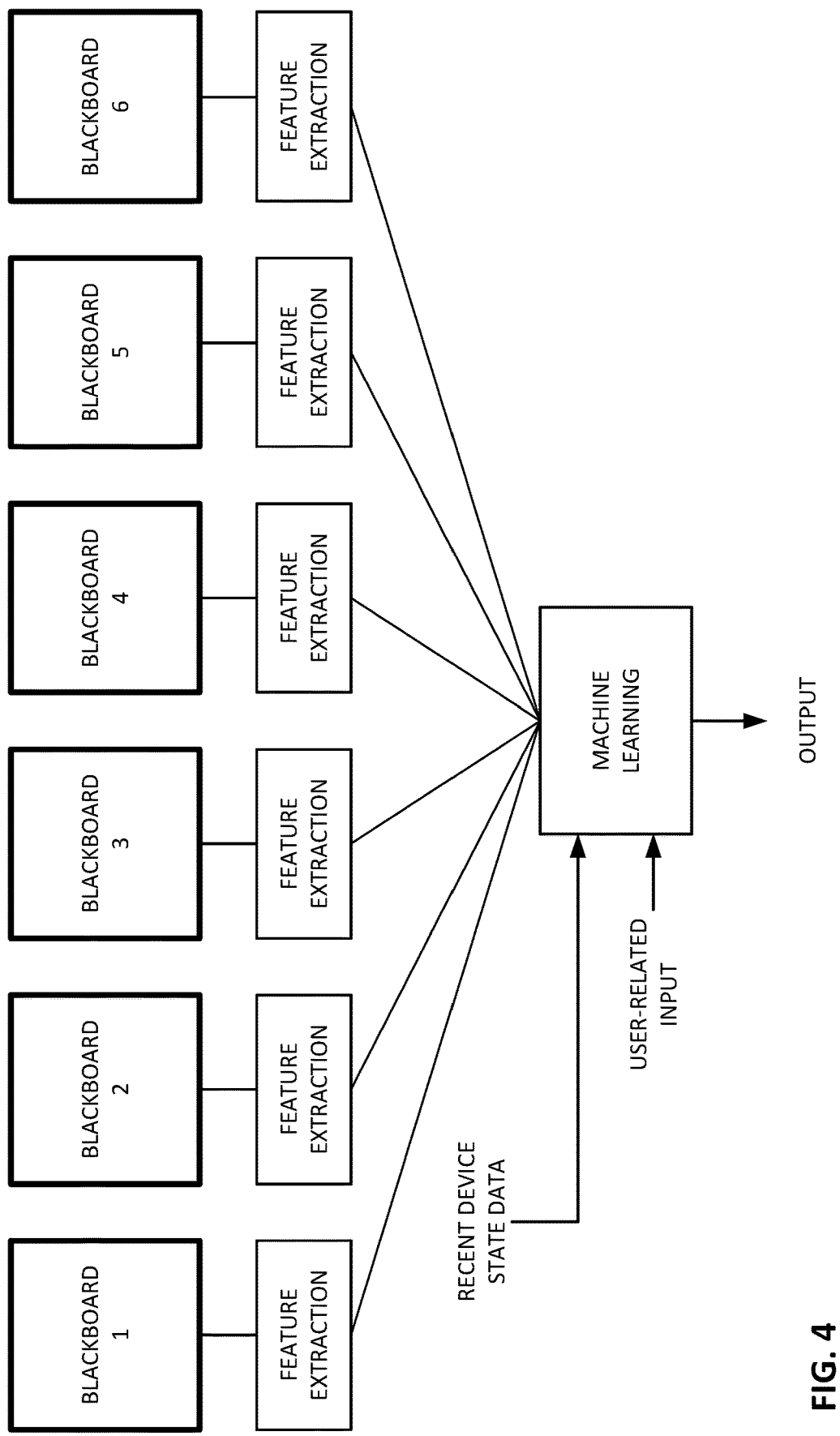
FIG. 4 shows how feature data extracted from plural memories can be applied to train a machine learning system.

Turning to FIG. 4, the feature data extracted from the various blackboards is applied to a machine learning system, operating in a training mode. The machine learning system also receives data about what sensor data are stored in what blackboards.

Also applied to the machine learning system can be information about the internal state of the smartphone, e.g., a log/history file detailing programs used, operations executed, user-established settings (some of which may be set, e.g., in the iPhone "Settings" user interface), and other smartphone parameters (hereafter shortened to "device state data").

Also applied to the machine learning system is user-related input. The user-related input is employed to discern user satisfaction (or, often, dissatisfaction), and can be of various types.

One type of user input is information about a user action. Some user actions involve user instructions to the smartphone, e.g., launching the phone's web browser, or another app (e.g., Facebook, Wikipedia); turning on the phone torch; starting a text message to a spouse; backspacing to correct typed text; recording audio; turning down a phone ringer; dismissing certain incoming calls, etc. User action can also involve changing any of the phone's operational parameters that are available, e.g., through the just-noted Settings user interface of the Apple iPhone 6 phone.

As a general principle, whenever a smartphone action is instituted by the user, this is a sign of negative feedback. That is, the previous state of affairs (whether of the smartphone, or the user's environment) did not satisfy the user; user intervention was required. Contextual computing fell short. Such feedback may be termed "device-indicated-sentiment."

Other user input may be sensed by phone sensors, but doesn't otherwise involve the phone, e.g., facial expressions (such as a frown), voice sentiment, and/or other biometric data tending to indicate happiness, confusion, surprise, disgust, sadness, anger, concentration, stress, heart and respiration rate, blood pressure, etc. (These can be sensed in known ways, including wrist- and face-worn devices, such as the Apple Watch and the Google Glass products.) Additionally, a change in any of these data over a relatively short period of time is also informative, as is the time-rate of such change, which may be termed the rate of emotional acceleration. (A "short period" here means within a minute, and can be further filtered to changes occurring within a 10-, 5- or 1.5-second interval, or less.) Also useful is detection of default user states, e.g., the user's normal facial affect, the user's resting heart- and respiration-rate, etc., so that conditions divergent from such states can be detected. Such input may be termed "biometrically-indicated-sentiment."

It will be recognized that user input can serve, variously, as a sign of positive user sentiment (e.g., sensed user happiness) or negative user sentiment (e.g., a quick rise in user stress, or a face expressing frustration (or changing to frustration)).

In accordance with another aspect, the present technology uses the just-detailed user input to identify moments at which the user's life might be made better, by some adjustment to the phone, or to the user's environment. These moments are termed "key moments" herein. For each such key moment, the present technology attempts to characterize the environmental context (e.g., motion, sound, etc.) and/or the device context (e.g., device state data) that immediately preceded the user input, so that such context can be recognized in the future. Such context may be termed "key moment context." When such a key moment context is thereafter recognized, the device can change its operation (compared to previous experience) to try and improve the user's experience.

Returning to the various contexts noted above (e.g., sensing that the user is riding in a car, or sensing that the user is outdoors), it should be understood that the reason a phone's knowledge of context is important, is so that it might prompt an action or adaptation that is contextually-suited to that context. Phones shouldn't sense user context simply to be nosy.

Recognizing that context doesn't matter to a phone unless the phone can do something in response, greatly narrows the contextual conditions that should be sensed. Certain embodiments of the present technology use this insight as a basis for making the challenge of automated context discovery tractable. Such technology senses instances of user dissatisfaction, and thereby discovers combinations of context conditions to which it should be alert in the future. By sensing user dissatisfaction, the phone is aided in making sense of other data—including that of its own sensors. It's sort of recursive.

FIG. 4 is an example of such an arrangement. The machine learning system acts to identify which patterns of feature data, and device state data, immediately precede different types of user input, thereby contextually characterizing the key moments at which user satisfaction might be improved.

Figure 5:
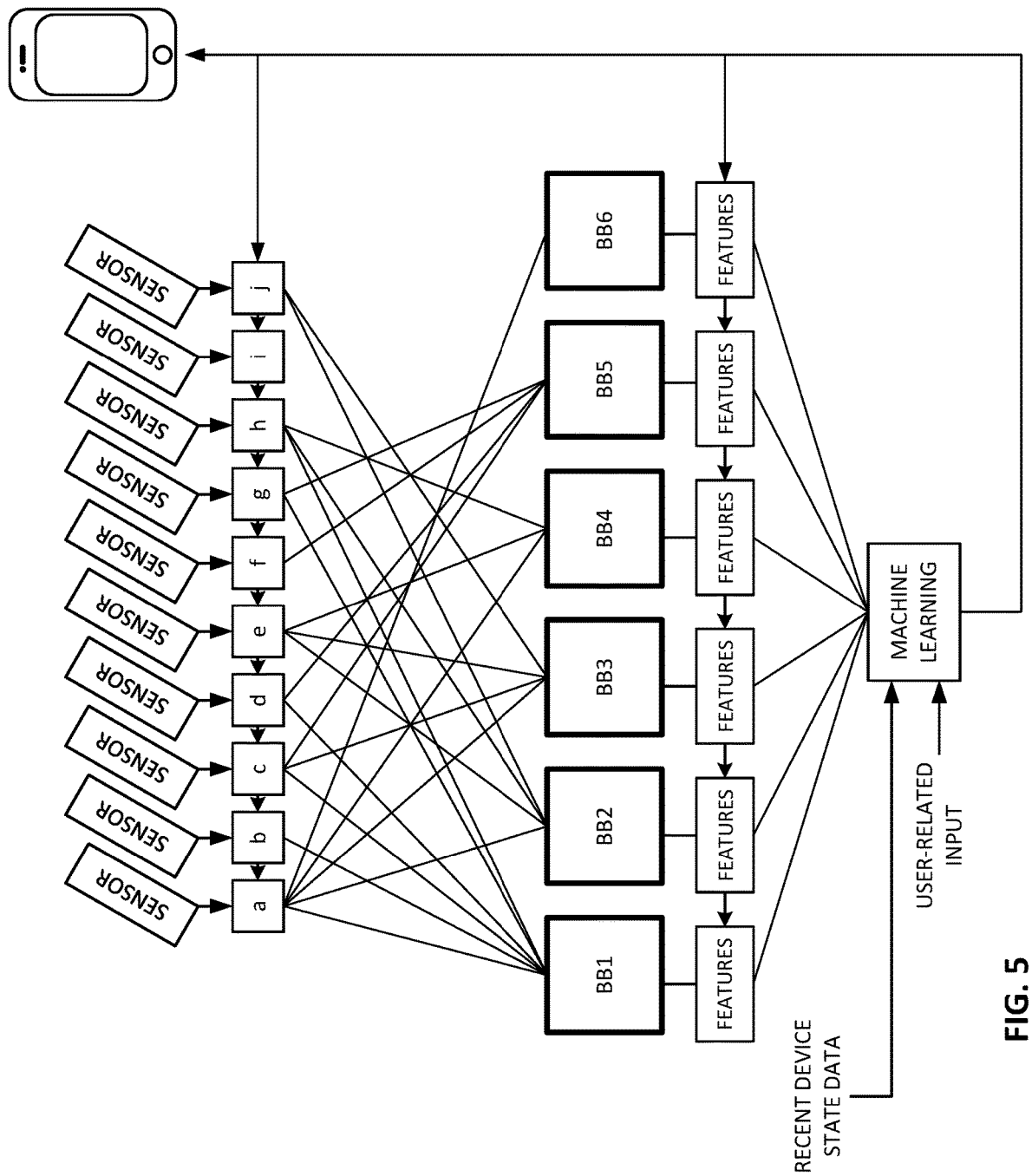
FIG. 5 illustrates how a phone may be trained to recognize various combinations of context conditions.

Over a large enough training experience, the user input reveals which groupings of sensor data on a blackboard, and which features detected from the blackboard data, are most satisfactory (e.g., least un-satisfactory) to the user in different contexts, e.g., prompting the fewest number of user instructions to the phone, or other negative user sentiments. These settings are then fed-back and used to configure operation of the logic gates, and the feature extraction units, on a go-forward operational basis, as shown in FIG. 5. Similarly, with enough training experience, the user input reveals which historical combinations of device state data seem user-annoying (e.g., the user frowns when they recur), thereby enabling modifications to device operation to better please the user (e.g., turning down the ringer volume).

(The upper right hand portion of FIG. 5 shows a smartphone. This might mislead, since everything shown in FIG. 5 can be part of this smartphone. The upper right hand portion signifies the feeding-back of information to modify and control operation of the phone, e.g., launching programs, varying parameters and Settings, etc.)

In accordance with a further aspect, the present technology detects ensembles of sensor feature data that commonly precede user actions, and then automatically initiates an action that the user seems commonly to launch in that contextual circumstance. The action may be an action on the user's smartphone (e.g., opening a browser window and navigating to a web page with traffic data), or it may be an action involving the surrounding environment, e.g., issuing a command to unlock a car. If the user does not respond by un-doing (reversing, canceling or countermanding) the device-initiated action, the action is presumed to have met a user need, and is thus employed when that same contextual circumstance arises again.

Similarly, and in accordance with another aspect, the present technology detects ensembles of device history data that commonly precede negative user sentiment. The device can thereafter be alert to the imminent re-occurrence of such conditions, and vary its operation in an attempt to avoid another negative user response. If such variation succeeds in avoiding a negative response, this variant is employed when those circumstances arise going-forward; else, a different variant can be trialed the next time those circumstances would otherwise arise.

Returning to FIG. 5, the reader may observe that trialing different combinations of data on different blackboards, and trialing different extracted features for their utility in discerning certain context conditions, are not—strictly—speaking, required. All of the sensor data may feed a shared feature extraction module—without first being grouped into different blackboards.

Moreover, for discovery of key moment contexts, even a shared feature extraction module is not essential. A machine learning system can be trained on data directly output from the sensors, without aggregating the sensor data into certain blackboard groupings, and without processing the blackboard data to extract different features, to discern patterns in sensor data that indicate key moments.

Figure 6:
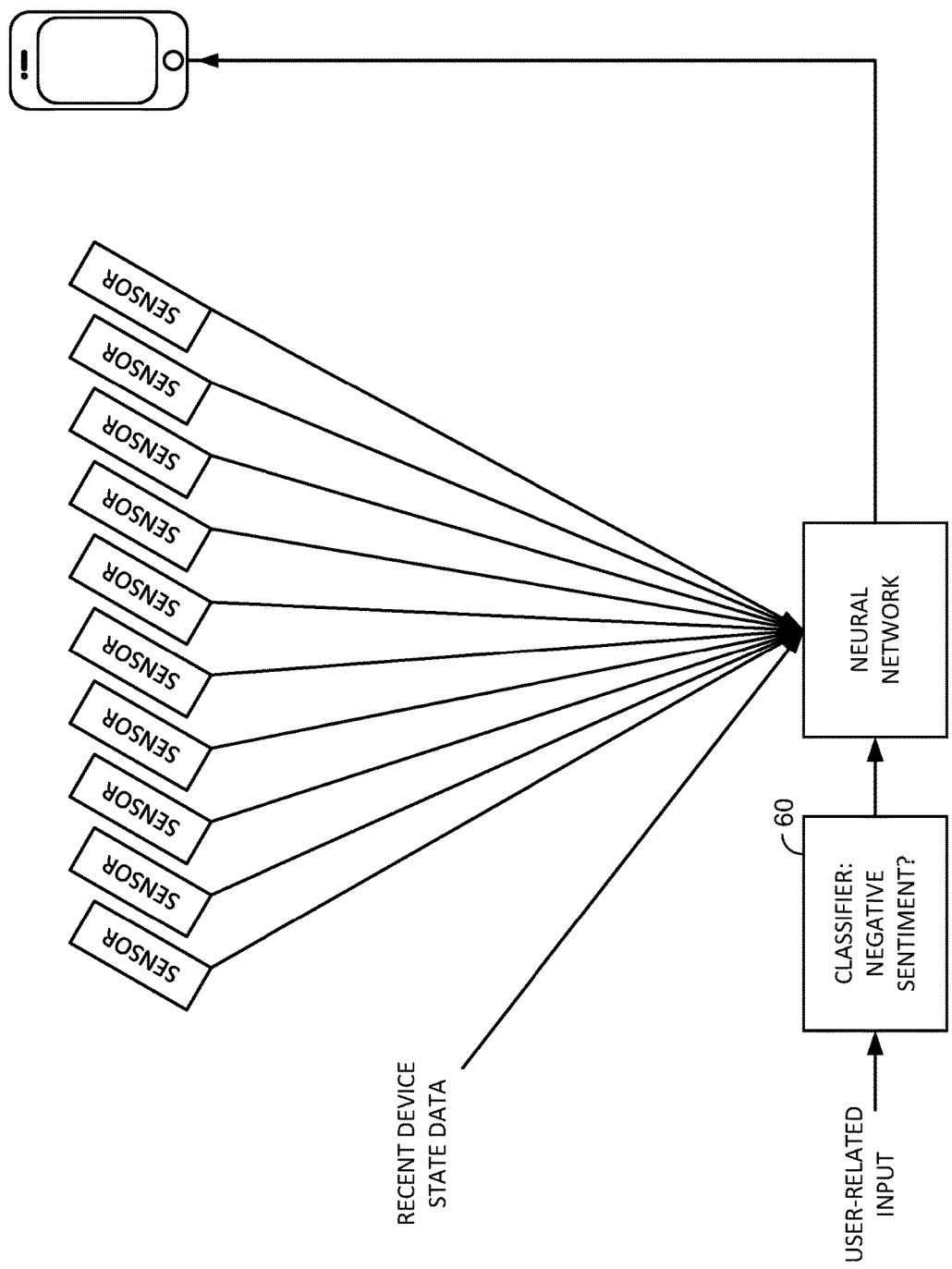
FIG. 6 shows a variation of the FIG. 5 arrangement employing, e.g., a user sentiment classifier.

Such a variant arrangement—lacking the blackboards, logic, and feature extraction modules—is shown in FIG. 6. In this embodiment, as in others, the machine learning component can comprise a neural network.

Included in FIG. 6 is a module 60 that classifies the user input as either (a) negative sentiment or (b) positive sentiment. Positive sentiment includes everything that is not unambiguously negative. For example, a neutral facial expression, or a voice stress that is ambiguous, are all regarded as positive. The primary object is to train the machine learning system to recognize negative sentiment. (Even negative sentiment may have an associated strength metric, and in some embodiments, only negative sentiment for which the metric exceeds a threshold value may be regarded as negative by the depicted classifier.)

As the neural network processes data from the sensors, and from the recent device state data, the sentiment data provided by the classifier serves as associated label data in a supervised learning sense. Vast regions of a multi-dimensional sensor data space are labeled as positive sentiment. Some regions of the sensor data space are labeled as negative sentiment, where compressed sensor data associated with key moments are found to cluster. As more data is processed, the various weights by which these labels are associated with different input conditions become further reinforced—training the system. Eventually, the machine learning system evolves into a classifier itself—identifying combinations of input sensor and device state data and history that likely yield negative sentiment, and those that likely yield positive sentiment.

Although FIG. 6 lacks the multiple memories and multiple feature extraction modules of FIG. 5, the FIG. 5 arrangement provides certain advantages. For example, it allows for more functionality to be integrated with the different sensors themselves. Many sensors employ silicon substrates, and provision of memory and processing (feature extraction) onto such substrates increases the utility of the individual sensor components. Pushing the processing to the sensors also enables the use of specialized circuitry—optimized for the particular types of signals output by particular types of sensor, and optimized for the particular tasks that need to be performed. Also, the more processing is performed at the sensor itself, the less processing is required of a general purpose processor (e.g., a smartphone CPU). General purpose CPUs are often relatively high power-consumption devices (due to their typically high clock rates), so shifting tasks to circuitry on the sensor substrates can save power.

Returning to FIGS. 5 and 6, if training of a machine learning system were left to a single individual, and to that individual's smartphone, a prohibitively long time period would be required to classify the universe of possible sensor data/device state data into two regions—one associated with negative sentiment, and one associated with positive sentiment. However, by distributing this exercise over hundreds or thousands of users, useful results can be achieved much more quickly. Once thus-determined, the resultant neural network weighting data can serve as baseline configuration data that is provided initially to all future user devices, and can then be further adapted to each user's idiosyncrasies through additional learning.

That is, once trained, the system can continue to learn. If negative user sentiment is encountered in a contextual condition that was formerly labeled as positive sentiment, the machine learning system can evolve to accommodate the new data. Neural network weights are adjusted accordingly.

Such adjustments to each user's neural network configuration can be reported to a common data store (e.g., in the cloud), and if certain adjustment are discovered to be beneficial across a large set of users (e.g., 30% or 50% or more), then such improvements can be included in the baseline configuration data thereafter issued to new user devices.

Figure 7:
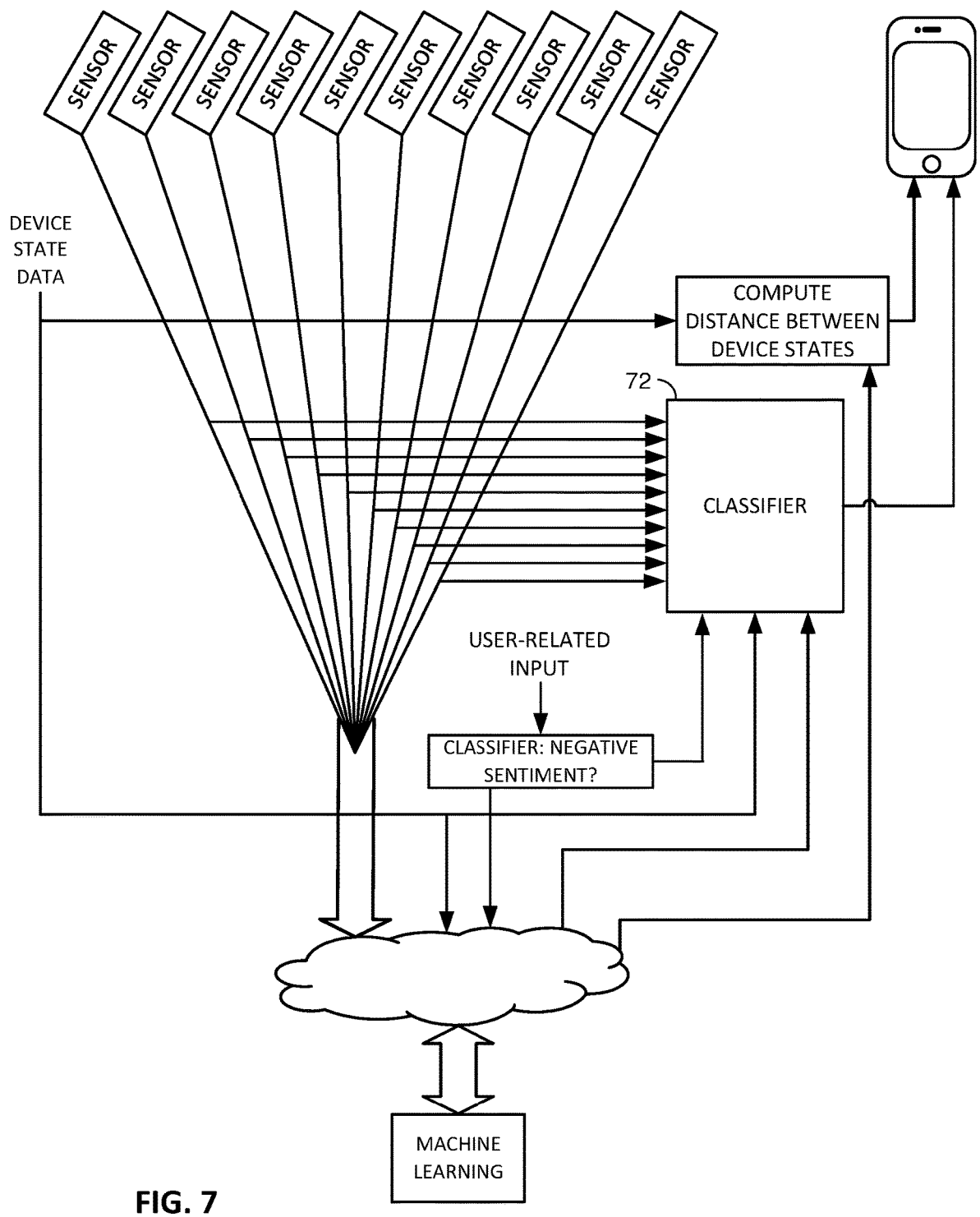
FIG. 7 shows a variation of the FIG. 6 arrangement employing, e.g., cloud-based machine learning.

Speaking of the cloud, it will be recognized that the machine learning can be performed in the cloud, e.g., using a support vector machine (SVM). Data from the user device can be sent to the cloud to train a machine learning system, and results can be returned to the user device to configure the system. FIG. 7 shows one such arrangement, with the machine learning system being located remote from the user, and accessed across a wide area network (typically part-wireless, and part-wired). Sensor data and device state data are sent to the remote machine learning system, together with classified user sentiment information that serves as label data. As in FIG. 6, the machine learning system uses this information to discern what collection of features in the sensor data, and in the device state data, tend to contextually characterize key moments. The remote system then returns related data to the smartphone. The smartphone uses this returned data to tailor its own operation. In particular, the returned data is used to establish the weights of a neural network classifier 72 used by the phone to recognize these key moments itself, by recognizing the associated contextual circumstances when they recur.

The returned data may also include device state data that was found by the machine learning system to immediately precede key moments. While the weighting data returned from the machine learning system can determine when the smartphone is thereafter in such a state, it can also be useful to alert the smartphone that it is approaching such a state.

To serve this need, FIG. 7 also includes a stage that computes a Euclidean distance between the current device state, and each of the device state contexts that were found, by the learning system, to be associated with negative user sentiment. This stage outputs a scalar value indicating, in a relative sense, how far the device is from one of the states that was earlier found to be dis-satisfying to the user. The time-rate-of-change of this scalar can also be computed, to determine how quickly the device is approaching one of these dis-satisfying states. If the scalar value indicates that the current operational state is close to one of these prior states, or if the rate-of-change value indicates that the device's operational state will soon be close to one of these prior states, then a signal can be issued alerting the phone to such condition, so it can take a responsive action. By being alert to the possible recurrence of a condition that prompted a user expression of negative sentiment, the phone may change its operation to see if a recurrence of the negative sentiment can be avoided.

A problem with the FIG. 7 system is the cost—e.g., in terms of data bandwidth and power consumption—to send all of a smartphone's sensor data to a remote cloud processor for analysis. In accordance with a further aspect of the technology, a form of lossy compression is employed on the sensor data—prior to transmission to the cloud processor.

Lossy compression systems are known in a variety of contexts; JPEG image compression is perhaps the most familiar. Such systems are often characterized by a many-to-one mapping. That is, several different input conditions may all yield an identical output condition. As a consequence, data input to a lossy compression system cannot (generally) be reconstructed from output data produced by the system.

Many lossy compression systems are complex, and cannot be implemented using a small number of hardware gates or a small number of software instructions. (JPEG, again, is a good example.) In accordance with a further aspect of the present technology, a lossy compression system for sensor data is realized in a simple form, enabling implementation with a small number of hardware gates or software instructions. ("Small" here means on the order of a few thousand or tens of thousands of gates; generally less than a million.)

In one such embodiment, the lossy compression takes—as input—a series of sensor-related data (which may be non-integer data), and produces—as output—a single datum (which is generally a small integer number). Matrix multiplication is a suitable approach. A particular implementation takes a matrix of values (comprising plural reference vectors), and multiplies that matrix by a vector of sensor data. The result is a vector of result values. The maximum value in that result vector is identified. The ordinal position of that largest value (i.e., the index of the position of that value within the result vector) is taken as the output of the process.

In an illustrative embodiment, the values of the matrix (i.e., the reference vectors) are, initially, randomly assigned. At least in this example, the matrix values don't have any intrinsic meaning.

The foregoing will be made clearer by an example. Consider a vector S of sensor data. The vector S may be, e.g., a series of samples of the user's heart rate—sensed at ten second intervals. The series may span a 30 seconds and comprise four samples (e.g., sampled at 0, 10, 20 and 30 seconds). This 4 element vector is multiplied by a 5 row by 4 column matrix C of values. The product yields a resultant 5 element vector R.

$$CS = R$$

An example with illustrative data is:

$$C * S = R$$

$$\begin{bmatrix} 60 & 55 & 76 & 10 \\ 15 & 77 & 36 & 81 \\ 89 & 5 & 62 & 25 \\ 90 & 62 & 17 & 13 \\ 55 & 14 & 12 & 95 \end{bmatrix} \begin{bmatrix} 95.5 \\ 97.0 \\ 100.4 \\ 104.7 \end{bmatrix} \begin{bmatrix} 19742.4 \\ 20996.6 \\ 17826.8 \\ 17676.9 \\ 17761.8 \end{bmatrix}$$

As is familiar, the top entry in the result vector (19742.4) was computed as:

60*95.5+55*97+76*100.4+10*104.7=19742.4

The second entry in the result vector (20996.6) was computed as:

15*95.5+77*97+36*100.4+81*104.7=20996.6

The third entry (17826.8) was computed as:

89*95.5+5*97+62*100.4+25*104.7=17826.8

The fourth entry (17676.9) was computed as:

90*95.5+62*97+17*100.4+13*104.7=17676.9

The fifth entry (17761.8) as computed as:

55*95.5+14*97+12*100.4+95*104.7=17761.8

In this example, the output datum is "2." That is, the second entry in the result vector (i.e., 20996.6) is the largest. (This corresponds to the second row of matrix coefficients and, as discussed below, indicates that the second row of matrix coefficients is closest to the vector of sample data—in a Euclidean geometry sense.)

Depending on the matrix coefficients and the sensor vector values, the result vector can include negative values. In some embodiments, the index value of the position having the highest absolute value is the output value—even if that high value is negative. In other embodiments, absolute magnitudes aren't considered—the output value is the ordinal position of the most positive value in the result vector.

The exemplary procedure reduces a series of four real-valued sensor data (which typically require 32 bits, each, to represent, for a total of 128 bits) to an output value that can have one of only five states (which requires only 3 bits to represent). The compression thus effects more than a 40:1 reduction in bit length.

Still greater compression ratios may be achieved. For example, if a vector of 64 real-valued sensor data (i.e., 2048 bits) is multiplied by a matrix having 32 rows, the index position in the result vector having the highest value can be represented by 5 bits. This compression effects more than a 400:1 reduction in bit length.

The artisan will recognize that the detailed procedure requires elemental operations of just multiply and add. Such functionality can thus be realized with a small number of gates. (Multiplying two N bit numbers requires $N^2$ NAND gates; adding two N-bit numbers requires 5N gates.) A few software instructions will also suffice.

In accordance with a further aspect of the present technology, a sensor is integrated with circuitry that produces a lossily-compressed output value, e.g., as detailed above.

Figure 8:
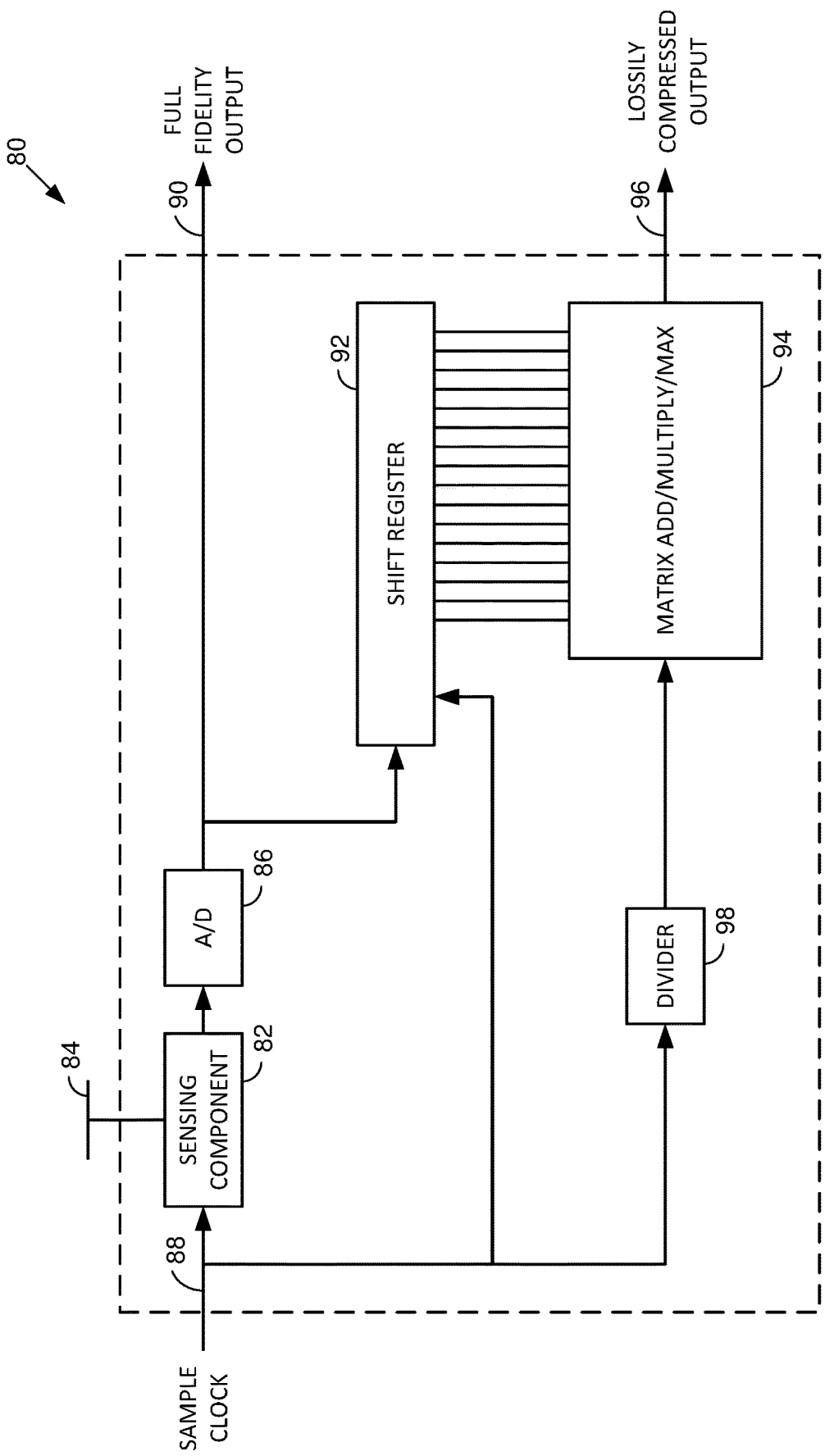
FIG. 8 is a circuit illustration for an improved sensor.

FIG. 8 shows such a sensor module 80. Included is a sensing component 82, which may include a portion thereof 84 that interfaces with the external environment. This sensing component may produce an analog output signal, which is digitized by an A/D converter 86. The sensing component 82 is triggered to act by a sample signal 88. The sample signal can be a recurring clock signal (e.g., ten times per second), or it can be activated on-demand to prompt production of an item of sensor data. The output of the A/D converter 86 provides a normal (full-fidelity) sensor output datum to an output 90.

The output of the A/D converter 86 is also fed to the input of a shift register 92, which is also clocked by the signal on line 88. Successive stages of the shift register thus store each successive value output by the A/D converter, up to the number of shift register stages. In the illustrated example, there are 16 stages, so a series of data comprising the last 16 outputs of the A/D converter are maintained by the shift register. (The shift register may thus be regarded as a form of data buffer or memory.)

These 16 data values from the shift register are applied to a matrix add/multiply/max module 94 that includes an array of gates configured to perform the matrix-related operations detailed above. Module 94 produces, on output 96, an integer datum that is the index of the position, in the result vector R, having the largest value. The result vector will have a length equal to the number of rows in the matrix. The number of rows in the matrix can be chosen by the designer based, e.g., on the number of different patterns in sensor data that are to be identified. If 64 patterns are to be identified, the matrix will be of size 64×16. The output will identify the position in the result vector that has the largest value. In this example, the output can be represented by $\log_2(64)$, or 6 bits A divider module 98 is optionally provided to control how often the illustrated sensor module 80 produces a lossily-compressed output datum.

If the sample clock 88 causes the sensing component 82 to produce ten samples per second, and there is no divider (or the divider is set to divide by one), the matrix module 94 will similarly produce ten values per second.

This is shown in FIG. 9A. Assuming the shift register 92 is filled with an initial 16 values, module 94 processes the series of sensor values comprising samples 1-16, and produces a first output value (e.g. "14") on output line 96. One clock cycle later, the module 94 processes samples 2-17, and produces a second output value (e.g., "37") on output 96. One clock cycle later, the module 94 produces a third output value (e.g., "3") based on sensor samples 3-18. Etc.

If the divider is set to five, then the lossily-compressed output on line 96 is provided at a slower rate—just twice per second.

This is shown in FIG. 9B. Again assuming the shift register 92 is filled, module 94 processes samples 1-16 and produces the first output value ("14") on line 96. Five more clock cycles occur before the divider module 98 triggers the matrix module 94 to produce a second output. This output (e.g., "54") is produced after the $21^{st}$ full fidelity sensor output sample is produced on line 90. Five more clock cycles occur before the divider 98 again triggers the matrix module to operate. The shift register now presents a series comprising sensor output values 11-26 to the matrix module, which yields a third output (e.g., "45").

It will be recognized that divider 98 effects a further data compression operation—enabling the sensor module to produce compressed output values at a rate slower than full fidelity output samples. Divider 98 may be conceived as a windowing module—defining a temporal window of full-fidelity sensor samples that are taken into account in producing a single compressed output value. This window slides through the series of full-fidelity output samples—basing each compressed output value on a different collection of full-fidelity samples.

Although the divider usually divides by a value between 1 and 16 (the particular value can be hardwired by logic circuitry or the like, or it may be programmable), the divider may divide by a larger number than 16. In this case, some of the full-fidelity sensor values provided on line 90 are not used in producing the compressed output values. For example, if the divider is set to 48, a first compressed output value is produced based on the most recent 16 full-fidelity sensor output samples. 4.8 seconds then passes before a second compressed output value is produced—based on the then-most recent 16 full-fidelity sensor output values. But between production of the first and second compressed output values, 32 full-fidelity sensor values are issued on line 90 and are not considered in generating any of the compressed values.

While in the illustrated embodiment, the divider "slaves" the production of compressed output values to the production of full-fidelity output values, this is not required. In other embodiments, a separate control signal can be used to can control the matrix module 94—independent of the rate at which data is samples by the sensing component 82. Such a control signal can be activated when a compressed output value is needed, rather than having production of compressed output values be free-running.

Desirably, all of the circuitry shown in FIG. 8 is integrated together on a common semiconductor substrate (e.g., silicon), and may be packaged as a discrete unit—to which just power, ground and a clock signal are provided as input, and which outputs two data streams: the full-fidelity sensor samples, and the lossily compressed values.

The FIG. 8 embodiment processes 16 sensor samples, to produce one of 64 output states. For expository convenience, the embodiment may be said to employ a "sample length" of 16, and an "order" of 64. These parameters can be set by the circuit designer as best fits different applications. Some sensor modules may have a sample length of 4 or less, while others may have sample lengths of 32, 128, 1024 or more. Similarly, the order of a sensor module may be as small as 2, or may be arbitrarily large. Orders in the range of dozens to hundreds are most common, but orders in the thousands are appropriate in some instances.

(Not shown in FIG. 8 are certain customary elements such as power and ground, circuitry to convert the output data to serial format, circuitry to load the reference matrix coefficients from memory, etc.)

Relating the FIG. 8 embodiment with earlier embodiments, the shift register serves in the memory role earlier filled by a blackboard. The matrix module serves as a feature extraction module.

Speaking of features, it should be understood that extracting features from sensor data (e.g., as in FIG. 4) does not increase the information content of the sensor data. Information that is already inherent in the sensor data may more clearly be revealed by an extracted feature, but no new information about the physical phenomenon being sensed is introduced.

Thus, while a feature extraction module could be employed in the FIG. 8 embodiment (e.g., between the A/D converter and the shift register, or between the shift register and the matrix module), applicant's preferred embodiment does not do so.

So if the matrix multiplication serves as a form of feature extraction, what does the feature, i.e., the output data on line 96, indicate?

As briefly noted earlier, the output data indicates which row of the matrix most closely approximates the vector of sensor data.

Each element of the output vector R is a dot product (an inner product in Euclidean space) between a row of matrix coefficients, and the vector of sensor data. That is, the matrix operation determines the geometrical projection of the sensor data vector onto each of the different vectors represented by the different rows of the matrix. (If any of the rows of the matrix is perfectly orthogonal to the sensor data vector, the dot product will yield a value of zero.)

In the FIG. 8 case, the four bits of output data on output 96 indicate which of the 64 different rows of the matrix has a pattern that is most similar to the pattern of sensor data in the shift register.

This can be seen in the earlier 5×4 matrix example, which was multiplied by a sensor data vector of 4 heart rate samples. In that case, the heart rate increased monotonically through time (95.5, 97, 100.4 and 104.7). The output datum in that case was "2," indicating that the dot product of the coefficients in the second row of the matrix, with the vector of heart rate samples, had the highest output value. Examining that second row, it will be seen that its coefficients do not increase monotonically. However, two of the three transitions were in a positive direction (i.e., 15 to 77, and 36 to 81). In contrast, none of the other four rows had two positive transitions. Thus, row 2 of that matrix was found to be most similar in pattern to the sequence of heart rate values.

FIG. 8 thus essentially checks a sequence of sensor data, and identifies which of 64 different patterns it most nearly resembles. These 64 patterns can correspond to 64 different key moment contexts. Taking accelerometer data as an example, these 64 key moment contexts may correspond to a free-falling phone, a phone traveling in a car, and 62 other contexts.

Figure 10A:
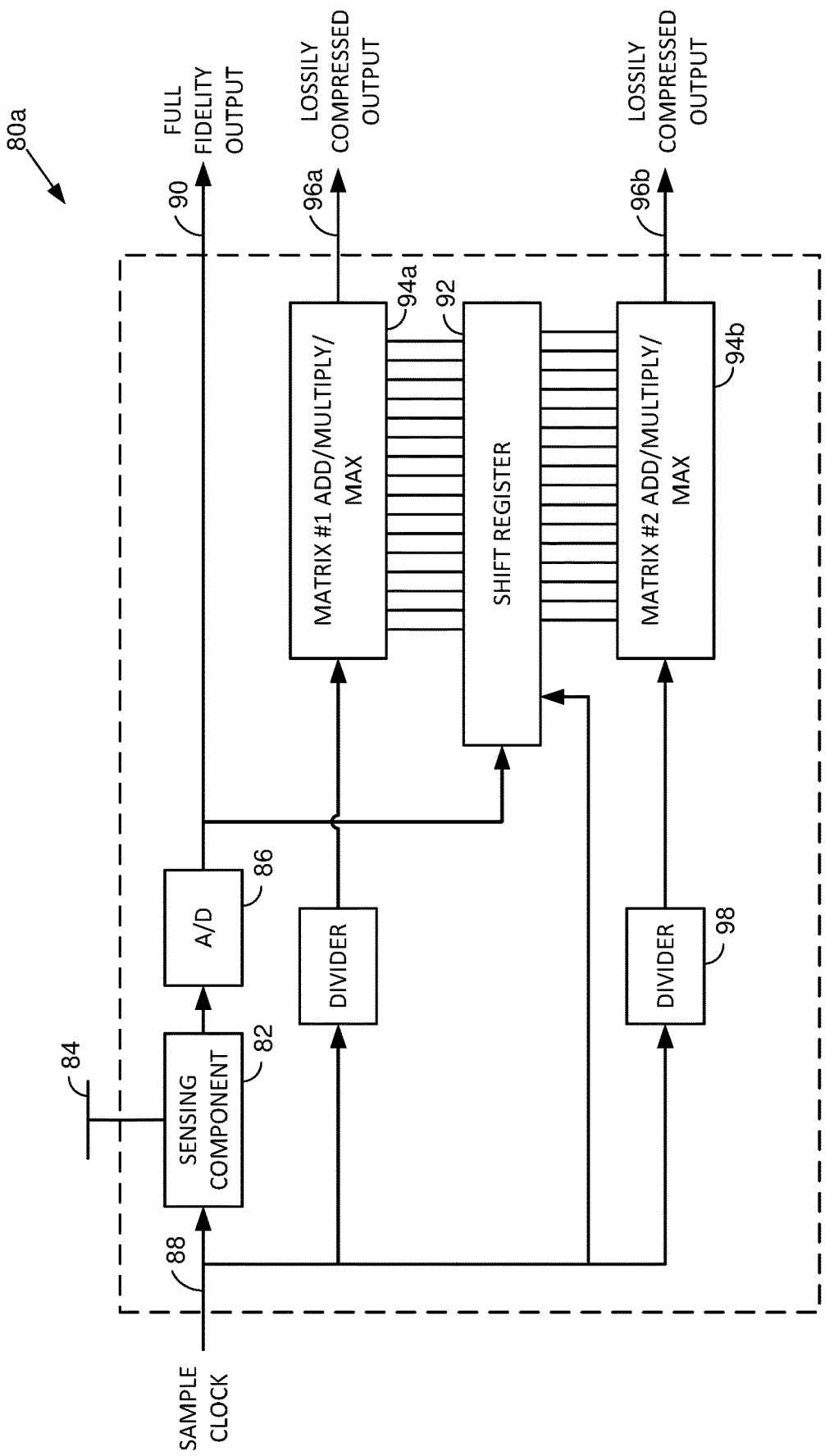
FIG. 10A shows a variation of the FIG. 8 circuit employing, e.g., multiple matrix modules.

Sometimes it is desirable to identify the best matches between the sensor data, and each of two different sets of patterns. FIG. 10A shows one approach.

In FIG. 10A, a single shift register feeds two matrix modules (94a, 94b). Each module has its own output (96a, 96b) which respectively indicates one of, e.g., 32, different outputs. This embodiment can thus check the sensor data for similarity with 32 different patterns in a first set, and 32 different patterns in a second set.

Figure 10B:
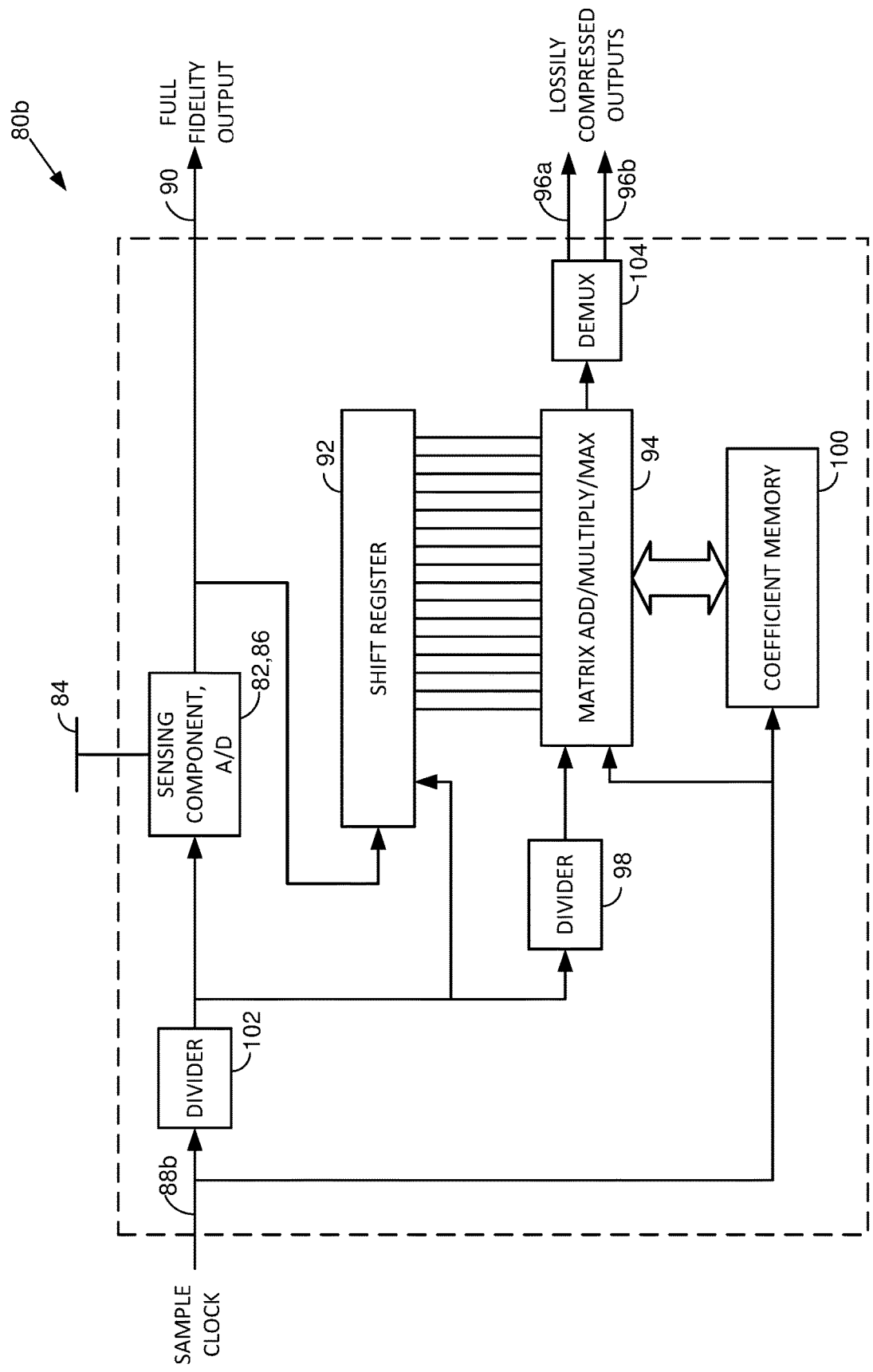
FIG. 10B shows a variation of the FIG. 8 circuit employing, e.g., multiplexed outputs.

FIG. 10B shows another approach. In this arrangement, first and second sets of matrix coefficients are alternately applied to the matrix module 94, from a coefficient memory 100. A clock rate twice that of FIG. 8 is used, and is divided by a new divider 102 before controlling the sampling of sensor component 82. In the period of a single clock cycle provided to the sensing component, the matrix module outputs two values—one produced with the first set of matrix coefficients, and one produced with the second. The two different matrices are each multiplied with a common set of sensor data from the shift register, yielding two output values. A demultiplexer 104 captures and latches these two different outputs values, and provides them to two outputs 96a and 96b.

While FIG. 10A showed use of two matrix modules to increase the number of patterns recognized, and while FIG. 10B employed first and second sets of matrix coefficients to achieve such a result, it will be recognized that the same approaches can be extended to recognize an arbitrary number of patterns from within a common set of sensor data.

It is often desirable that all the matrix rows define vectors of the same length (or within 2-5%). That is, the square root of the sum of the squared coefficients in each row should match the similarly-calculated magnitude for each other row.

An exemplary embodiment randomly generates real or integer numbers for each of the matrix coefficients, e.g., between 0 and 100. The magnitude of the vector represented by each row of the matrix is then computed, based on the square root of the sum of the squares. The magnitude of the shortest vector is selected as a target, and each of the other vectors is reduced in magnitude to match this target value, by reducing the values of some or all of its component coefficients. In another embodiment, different coefficients are randomly generated and grouped into a vector, and the length of the vector is computed. If the length is more than a threshold distance away from a target value, the vector is discarded; else it is retained for use as a row of matrix coefficients. The process repeats until a desired number of satisfactory vectors has been obtained.

With such randomly-identified matrix coefficients, the FIG. 8 embodiment will discern the closest-matching of 64 different patterns in the sensor data. However, these 64 different patterns may not be useful as key moment contexts. Thus, as with the embodiments earlier-discussed, the system's parameters (here, the matrix coefficients) are desirably varied over time, and the results analyzed by a machine learning system, to discern the parameters that yield the most useful results.

Figure 11:
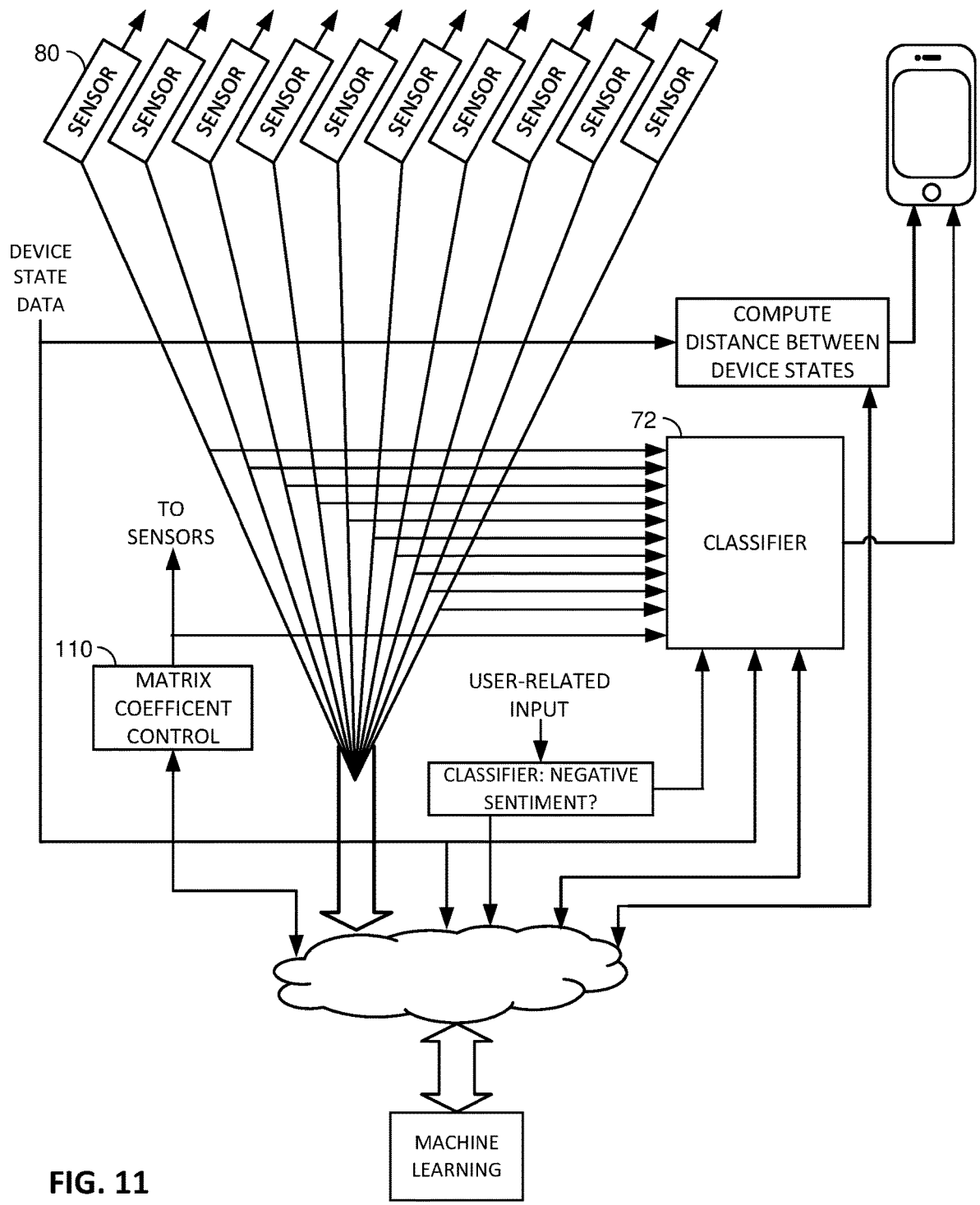
FIG. 11 shows a variation of the FIG. 7 arrangement employing, e.g., a matrix coefficient control module.

Referring to FIG. 11, an arrangement akin to that of FIG. 7 is shown. The sensors are sensor modules 80 of the type just-described. Each has two outputs—a full-fidelity output (shown by the upward-pointing arrow), and a compressed output. The compressed outputs can be tagged to identify the sensor module from which they originated (e.g., by appending a bit string identifying the module, not shown), and are fed to a remote machine learning system.

A new element is introduced in FIG. 11—a matrix coefficient control module 110. This module randomly assigns the matrix coefficients for the sensor modules, and optionally assures that each has approximately equal row-vector magnitudes (as just-described). In addition to providing coefficients to the sensor modules, this module also provides data to the remote machine learning system, so that it is informed of the configuration of the matrix modules.

The coefficients, themselves, needn't be sent to the remote machine learning system. Instead, the module 110 may send to the remote system, for each row of coefficients in a particular matrix, (a) an identifier of the sensor module where that row is employed; (b) a unique identifier (UID) for that row, and (c) data indicating the ordinal position of that row in that sensor module's matrix. (Information (a) and (b) can be consolidated by including, in the UID that identifies a series of coefficients, a plural-bit field that identifies the sensor module in which that row of coefficients is employed. The same bit string that was appended to the compressed output values, for purposes of sensor module identification, can be used.)

The correspondence between each UID and a series of actual row coefficients is stored in a memory in the phone (e.g., which may be in the control module 110). FIG. 12 illustrates an exemplary organization of such a memory, which is here shown as a table of multiple rows—each detailing information for a particular matrix row in a particular sensor module. The first column in each row provides the UID, represented in hex. As noted, part of the UID is a bit string identifying the sensor module. In the depicted example, the first two hex symbols comprise this identifier, e.g., "9A" for a heart rate sensor module, and "F4" for the next sensor module. The remaining symbols of the UID are arbitrary. The second column indicates which matrix row in the identified sensor module contains the detailed coefficients. The third row details the coefficients themselves.

Only the first two columns of data need to be transmitted to the cloud learning system.

Just as with FIG. 7, the machine learning system monitors the data sent from the phone to identify conditions that correlate with different expressions of user sentiment. Ensembles of received data that correspond with negative user sentiment are labeled accordingly, as are ensembles of data that correspond with non-negative user sentiment.

The sensor module data sent to the machine learning system may be of the form, e.g., 9A2. The "9A" identifies a sensor module (e.g., the heart rate sensor module in the earlier example). The "2" indicates that the second element in the result of the matrix multiplication was the largest, as in the illustrative case discussed above. (In actual implementation, the element numbering starts from 0, so the second element would be indicated by "1," but that nuance can be confusing, so is disregarded here.) Since the 2d element was the largest, this indicates that the second row of coefficients in the heart sensor matrix defined a vector that was most similar to the recent heart rate data samples. Information earlier sent to the cloud learning machine from the FIG. 12 table shows that this second row of coefficients has the UID 9A474737.

If the 9A2 datum is received by the machine learning system when user sentiment is classified as negative, the machine learning system increases a weight associated with UID 9A474737. It likewise increases weights associated with myriad other UIDs that are then-indicated by received sensor data, and thus associated with an incident of negative sentiment. Many of these UIDs are actually irrelevant to negative user sentiment, and serve as noise. But over a long enough training interval (or across a large enough collection of phones), UIDs that strongly correlate with negative sentiment will emerge, accumulating weightings that far exceed those of other UIDs. The UIDs for each sensor module that are identified by such process as being most useful in identifying key moments (e.g., negative user sentiment), are ultimately assembled together to populate the matrix of that sensor module.

Some key moment contexts are a bit chameleon-like, in that they have different appearances depending on exactly how-sampled. An example is a sensor whose output, at a key moment, alternates between high and low values at a rate of 5 cycles per second. This pattern may be recognized by use of a row of matrix coefficients that have a high-low-high-low . . . pattern. But depending on when sampling begins, this row of matrix coefficients may not be the one that yields the highest dot product value, so another row of the matrix may—by happenstance—be designated as the output value.

Desirably, such instances of aberrant sampling will be encountered during training, and will cause a second, out-of-phase, row of matrix coefficients (e.g., low-high-low-high . . . ) to also be discovered as indicating that same key moment context. Thus, certain key moment contexts may have several rows of matrix coefficients that are useful in their detection, depending on the sampling circumstances.

In the FIG. 11 arrangement, the machine learning system does not know what type of negative user sentiment was expressed, nor what any of the UIDs signifies. It just finds correlations between certain UIDs and the occurrence of negative user sentiment.

In another embodiment, the machine learning system is provided richer user-related input data. (E.g., the user sentiment classifier 60 of FIG. 11 can be omitted.) This allows correlations to be established between different UIDs and different negative user expressions. Some UIDs may correlate with negative sentiment evident by the user taking an action with the phone (device-indicated-sentiment). Other UIDs may correlate with negative sentiment evidenced by biometric data (biometrically-indicated-sentiment). Still finer granularities of negative sentiment can be distinguished, e.g., the user launching Wikipedia, the user launching a web browser, the user starting a text message to her husband, the user's heart rate escalating, the user changing a facial expression to one of frustration, etc.

Often, after initial training, each sensor module matrix is filled with coefficients whose UIDs have most frequently been associated with negative user sentiment. If there are 32 rows in the matrix, those coefficients are populated based on the 32 most frequently-recurring UIDs that were associated with negative sentiment. But if finer granularity about user sentiment is available, then the resource of matrix rows can be allocated.

A simple allocation is to divide the available number of matrix rows into N groups, where N is the number of different types of negative sentiment that the machine learning system has associated with UIDs. For example, if the machine learning system identifies some UIDs with negative device-indicated-sentiment, and others with negative biometrically-indicated-sentiment, then the 16 UIDs that most frequently correlate with the former can determine 16 rows of the matrix, and the 16 UIDs that most frequently correlate with the latter can determine the remaining 16 rows of the matrix.

As described above, the machine learning system acts, in essence, to compile histograms that identify which UIDs are most commonly associated with which user sentiments. But this is just part of what it does. The machine learning system also monitors which combinations of UIDs, from different sensor modules, are most commonly associated with which sentiment. Thus, UID 9A474737 may not strongly correlate with negative device-indicated-sentiment unless it co-occurs with UID F4C1480A or UID A5D48DDA. Thus, it may be the co-occurrence of several UIDs, as evidenced by the data output by the sensor modules, which indicates a particular user sentiment.

Moreover, the device state data can play a role. The machine learning system may discern that the co-occurrence of UIDs 9A474737 and A5D48DDA correlates negative device-indicated-sentiment only if the device is in a particular state (e.g., Bluetooth is off, DoNotDisturb is set to yes, and/or Notifications on the phone's lock screen are turned on).

Again, the weightings that are discerned by the machine learning machine, to discriminate context conditions indicating negative user sentiment from other conditions, are provided from the remote system to the classifier 72 in the phone, enabling the phone to recognize such sentiment on its own. Again, matrix coefficients for the UIDs that were found most useful in recognizing negative sentiment are used to configure the various sensor modules.

Through enough use of such technology over enough time, matrix coefficients that are found to be widely useful for different sensor modules will come to be recognized. In accordance with a further aspect of the technology, sensor modules are manufactured with such coefficients already in place. Out of the box, an accelerometer will be equipped to output data that are useful (singly, or in combination with data from other sensors) indicating common context conditions, such as walking, running, riding in a vehicle, sitting in an office, etc. (E.g., a compressed output value of 7 or 31 indicates the user is likely walking; an output value of 4, 14 or 27 indicates the user is likely running, etc.) Such programming can be effected by customized hardware circuitry on the sensor substrate, by data burned into ROM, etc. Some such sensors may additionally enable customization, e.g., by discovery of new matrix coefficients that suit the particular end user. For example, the arrangement of FIG. 10A can be employed, with matrix 94a configured with fixed coefficients (i.e., not able to be altered), and matrix 94b configured with coefficients that can be updated based on user-specific training.

Figure 13:
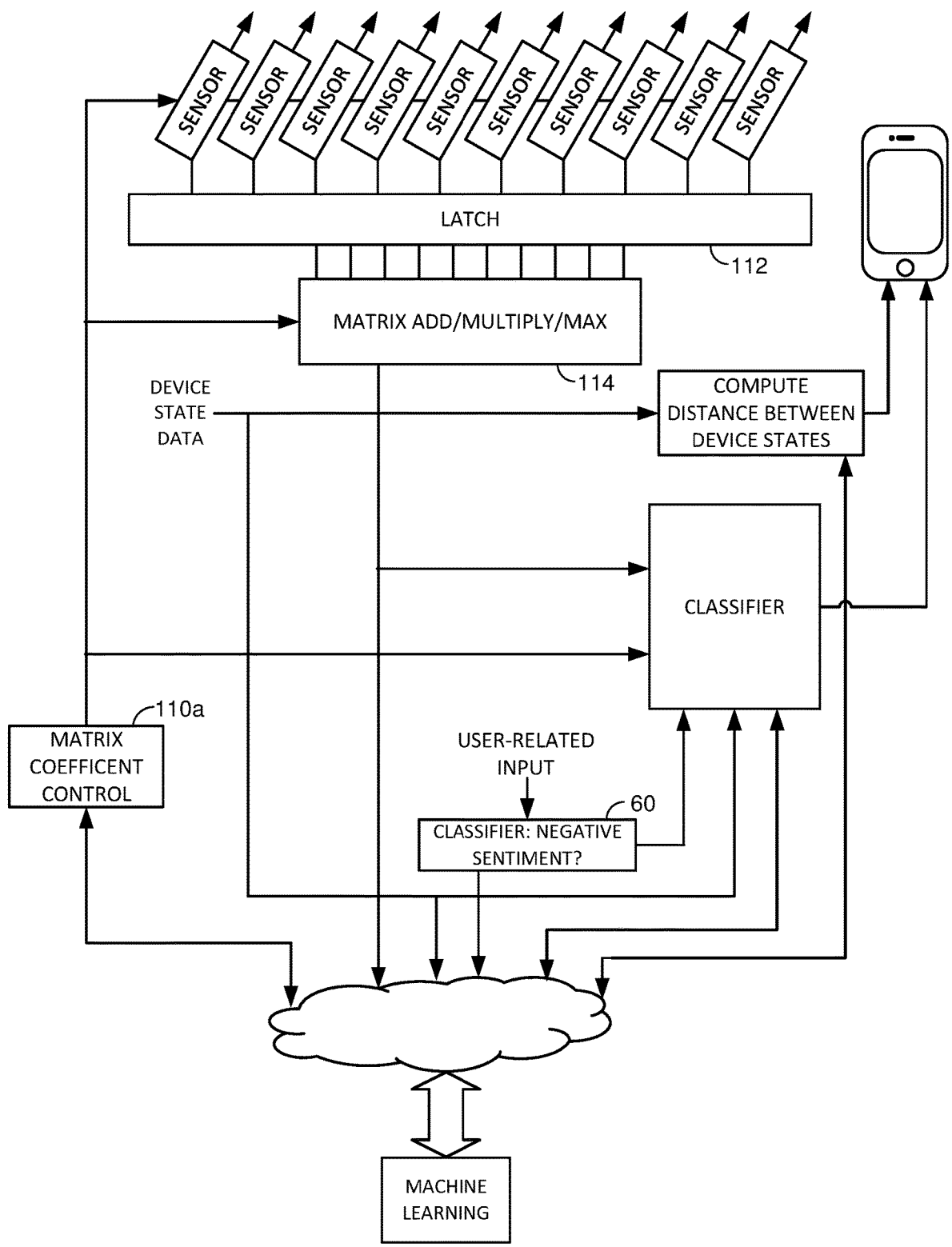
FIG. 13 shows a variation of the FIG. 11 arrangement employing, e.g., a latch module.

As noted, many context conditions are characterized by a confluence of conditions, sensed by different sensors. The matrix techniques described above can be extended to detect coincidence of conditions across some or all of the sensor modules. Such an arrangement is shown in FIG. 13. New in this arrangement is a latch module 112. Since the various sensor modules 80 in a phone may operate asynchronously (e.g., providing output values at different times, and updating at different rates), it is necessary to collect a fixed ensemble of output values on which to operate. This is the purpose of latch module 112—retaining the most recent output from each of the sensor modules 80, and holding that value during operation of a new matrix module 114.

As before, a matrix module 114 multiplies a matrix of coefficients (having a number of columns equal to the number of sensor modules 80) by a vector comprising the compressed output values held by latch 112 from sensor modules 80. Again, the ordinal of the element in the resultant vector that has the largest magnitude is taken as the output of this operation.

As in the previous examples, the output from the matrix module 114 of FIG. 13 is an integer that indicates which row of matrix coefficients most closely corresponds to the pattern of input data. This output value is provided to the remote machine learning system, for use in discerning contextual circumstances associated with different user sentiment. As before, results of such training are returned to the phone and used to configure a classifier, so it can recognize key moment contexts in the same manner as the machine learning system. (Alternatively, the remote system can be used as the classifier, once trained.)

Again, the coefficients in the new matrix module 114 are varied randomly, to enable the machine learning system to discern which row coefficients are useful in discerning different key moment contexts. These coefficients are controlled by the matrix coefficient control module 110a.

Some sensor data may have no relevance to certain varieties of key moments. Humidity may be an example. Key moments are typically uncorrelated with patterns in humidity data. But inclusion of such irrelevant data from the latch 112 into the matrix module 114 will ultimately make no difference. The randomly-trialed matrix coefficients will tend to converge on row vectors in which the coefficient corresponding to humidity approaches zero. The system will learn not to give humidity any weight (or, more accurately, it will learn to give greater weights to other parameters).

It is desirable, although not necessary, for the matrix modules of the individual sensor modules 80 to be configured using data from the remote machine learning system, before the further matrix module 114 is introduced. Coefficients for module 114 can then be trained in a second phase of operation.

Alternatively, compressed output data from each of the sensor modules 80 can be provided to the remote learning system, together with the compressed output values from the matrix module 114. In this case, training can occur in a single phase—learning the matrix coefficients for both the individual matrix modules in the sensors 80, and the matrix module 114, in one integrated process.

In a variant embodiment, the compressed output from each sensor module is provided to a shift register, which presents on its output the current compressed datum from the sensor module, together with its three prior data. A sequence of four data is thus presented for each sensor module. All four of these output data from each sensor are latched by the latch 112, and all four are taken as input by the matrix module 114. The matrix has four-times as many columns, due to the 4× increase in the size of the input vector. In such an arrangement, the compressed output data from the matrix module 114 is not a factor solely of the current sensor module outputs, but also of their recent history.

A latch-based matrix arrangement, like that of FIG. 13, can similarly be applied to produce compressed output data indicating device state data. That is, data indicating different parameters of state data can be provided to a latch, from which a matrix module generates compressed output data. This compressed output data can be among the information provided to the machine learning system to help identify key moment contexts. (As just described, the recent history of each such parameter can likewise be latched and considered.)

(It will be recognized that an ensemble of device state data associated with a key moment is, itself, a form of "feature" that is sensed by such an arrangement—albeit identifying a characteristic state in the device's electronic operation, rather than a characteristic state in the device's physical environment.)

CONCLUDING REMARKS

Having described and illustrated the principles of our inventive work with reference to illustrative examples, it will be recognized that the technology is not so limited.

For example, the matrix coefficients (UIDs) that are useful to recognize key moments can, themselves, vary with context. For example, one set of coefficients may be found most suitable for use in the morning, and a different set may be found most useful in the evening. Similarly, one set of coefficients may be found to best serve a user when at her office, while a different set may be preferred at home. Weekdays may be best served by some UIDs; weekends by others. By providing context data to the remote learning system (e.g., re time of day, day of week, and location), these differences can be discerned. The phone's sensor modules can then employ the matrix coefficients that best suit different contexts.

While certain embodiments (e.g., FIG. 11) make use of a remote machine learning system, it should be understood that the machine learning functionality can be implemented in the phone, itself, or by a unit in a personal area network.

The artisan will recognize that the machine learning system can take various forms. Neural networks, support vector machines, convolutional neural networks, spiking neural networks, deep learning, and neuromorphic computing, are examples. Suitable open source and commercial machine learning systems are identified in the Wikipedia "Machine Learning" article. The artisan can select a particular technology that best fits particular constraints of the application environment.

The specification uses various terms of temporal relationship, e.g., speaking of "recent," "immediately preceding," "coincide," "concurrent," etc. These terms are generally taken to refer to events that occur within a ten second interval of each other, or more typically within five seconds or two seconds of one another (or in some instances, within a second or less).

Reference is also made to a user device in a "sleep" state. This term is meant to mean a reduced-power state in which a screen is dark, and no audio is being rendered to an audio output transducer. Certain of the device's internal circuitry is unpowered or operated at a reduced voltage or at a reduced clock rate. Yet certain other circuitry is active, including one or more sensors.

Certain artisans will recognize that discovery of matrix coefficients in the detailed embodiments, by random variation and testing to determine which are best suited to the user, is a type of genetic algorithm.

Although the detailed methods for establishing random matrix coefficients produced coefficients that are always positive, this need not be the case. Other embodiments may, for example, randomly generate coefficients in the range $\{-100,100\}$ for trialing by the detailed methods.

In other arrangements, a common set of coefficients can populate the matrix module, but can be randomly rotated (in a circular list fashion) to effect variation.

While the disclosure focused on sensor data generated within the phone, the same principles are applicable to sensor data generated elsewhere, e.g., in the user's environment (such as a sensor in the user's car). If such sensor data is generated by a prior art sensor (e.g., without lossy compression), it can be relayed to a user device, where it is processed using, e.g., the FIG. 8 arrangement, to produce lossily compressed data. It can thereafter be processed using the arrangements detailed herein.

Some sensors have multiple sensing components. Examples are 3D accelerometers, magnetometers, and gyroscopes, which have different sensing elements for each of three orthogonal axes. Sensor modules incorporating such sensors can process each of the outputs separately, yielding three lossily-compressed outputs.

Still further, the lossy compression arrangement detailed herein can be employed with data different than a temporal series of sensor output samples. In addition to device state data, and data from previous matrix modules/sensing systems, the matrix operations can be performed on an array of data comprising, e.g., the maximum pixel value in each 16×16 block of imagery across a width of an image, or spectral coefficients in a linear or logarithmic audio spectrogram. The inputs to the matrix operation can thus be any collection of data (although facts based on sensor data may be most common).

As noted, training can continue after the device has been initially configured. Training can continue in a background mode, or it can be activated just periodically, e.g., for a different day each week, or for a different 90- or 20-minute interval each day.

It will be understood that when two elements are said to be coupled together, this contemplates that there may be one or more intervening elements; there needn't be a direct connection.

The training may not consider totally-new matrix coefficients, but may instead adjust (tweak) individual ones (or groups) of coefficients, to determine whether the adjustment is beneficial, or not. Each assessment of such a change may inform what type, or magnitude, or change might next be tried.

In some embodiments, full-fidelity sensor information is among the data sent to the remote processor (with the other information identified in FIG. 13), and such data are stored for training. The remote processor applies its own matrix operations on the data—trying different rows of coefficient data (e.g., randomly, or iteratively-tweaked) to identify those that seem best to identify key moment contexts. The resulting coefficient data are then sent to the phone for use.

In a related embodiment, full-fidelity sensor data can be cached in the phone. When the phone is plugged-in to a source of power, and is not otherwise occupied, it can process the same sensor data multiple times—each with a different set of matrix coefficients. This may be regarded as the phone "dreaming"—trying new or tweaked matrix coefficients. As before, the results are analyzed to determine which coefficients yield best results.

In some systems, a phone is in a sleep state but sensing system 80 is powered to monitor context. When a certain context condition is detected (i.e., the compressed output value matches a certain condition), one or more higher power elements of the system are activated (e.g., woken-up) to respond. For example, the higher power element may be a processor, which is energized to analyze the full-fidelity output of the sensing system—but only if the compressed output value suggests that such analysis may be warranted. Or the higher power element may be a wireless transmitter that relays sensor data to a remote processor for analysis. Thus, sensing systems 80 can be used to conserve power—by making a low power assessment of sensor data, and triggering a higher power (and more comprehensive) processing of the sensor data only when needed.

More generally, the output from a sensor 80 can be used to trigger a system to change states, based on the compressed output value.

In some embodiments, the phone is allowed to take random actions. For example, on the occurrence of certain compressed output data from certain sensors, the phone may try launching the browser, or another app (e.g., Wikipedia). If the user shuts the browser/app, then the matrix(es) that led the phone to try such action is/are virtually punished. If the user allows the browser/app to continue running, then such matrix(es) is/are reinforced.

While the detailed embodiment provided a matrix module within the sensing system 80, in other arrangements one or more matrix modules can be provided elsewhere, e.g., in a sensor hub that serves several different sensors. (If operation of the matrix module is not designed, or configured, to correspond to the rate at which full-fidelity sensor data is produced, it may be necessary to adjust the full-fidelity sensor data accordingly. In some instances it may be appropriate to zero-pad the sensor data, to increase the number of sensor samples available in a given time interval. In other instances, it may be appropriate to skip, or average, certain sensor samples, to comply with timing conditions.)

In implementations that send and receive data to a cloud processor, it will be recognized that a variety of data channels can be used. In addition to customary mobile internet services (e.g., 4G), the data can be conveyed as SMS data. (A phone's radio exchanges with its associated base station follow a standard protocol (SS7), which includes a Mobile Application Part (MAP). MAP provides an application layer for the various nodes (e.g., phones, base stations) to communicate with each other and provide services. One of these services is the Short Message Service (SMS). SMS data (up to about 1120 bits) is included as a signaling channel in various of these recurring phone-base radio exchanges.) The technical details associated with SMS are familiar to the artisan, as detailed in the Wikipedia article "Short message service technical realisation (GSM)" and as further detailed in the 3GPP Technical Specification "Digital cellular telecommunications system (Phase 2+); Universal Mobile Telecommunications System (UMTS); Technical realization of the Short Message Service (SMS) (3GPP TS 23.040 version 12.2.0 Release 12).")

Alternatively, voice or image content sent to and from the phone can be steganographically-encoded to convey the additional sensor/context related information.

In training, the data sent from the phone to the remote machine learning system can be queued over the course of minutes, hours, or days in a phone cache memory, and divided/transmitted to the remote system when channel (e.g., SMS message capacity) or other circumstances best permit. Likewise with information returned from the remote system to the phone. Realtime streaming of such data is generally not necessary. Such arrangement extends phone battery life, as transmission of compressed sensor data piggybacks on wireless transmissions that are made for other purposes.

Although reference was made to grouping different kinds of sensor data in different data structures (e.g., blackboards), it will be recognized that plural such data structures can be implemented in a single physical memory system. That is, the different data structures may only be logically or virtually, not physically, distinct.

The reader of applicant's earlier intuitive computing patent filings will recognize that the compressed output values from sensing system 80 are a variety of key-vector data. (So is the vector of data resulting from the matrix multiplication, which can be output from the sensing system in some embodiments.) Such data may also be regarded as feature data.

While reference has been made to smartphones, it will be recognized that this technology finds utility with all manner of devices—both portable and fixed. Devices including wrist- and head-mounted systems, jewelry (e.g., bracelets, rings), hats, shoes, and other wearable systems—whether worn by the user or others, vehicles, etc., can all make use of the principles detailed herein. (The term "smartphone" should be construed herein to encompass all such devices, even those that are not telephones.)

Particularly contemplated smartphones include the Apple iPhone 6; smartphones following Google's Android specification (e.g., the Galaxy S6 phone, manufactured by Samsung, and the Google Moto X phone, made by Motorola), and Windows 8 mobile phones (e.g., the Nokia Lumia 1020).

Details of the Apple iPhone, including its touch interface, are provided in Apple's published patent application 20080174570.

The design of computing devices referenced in this disclosure is familiar to the artisan. In general terms, each includes one or more processors, one or more memories (e.g. RAM), storage (e.g., a disk or flash memory), a user interface (which may include, e.g., a keypad, a TFT LCD or OLED display screen, touch or other gesture sensors, a camera or other optical sensor, one or more microphones, etc., together with software instructions for providing a graphical user interface), interconnections between these elements (e.g., buses), and an interface for communicating with other devices (which may be wireless, such as GSM, 4G, CDMA, WiFi, WiMax, Zigbee or Bluetooth, and/or wired, such as through an Ethernet local area network, etc.).

The processes and system components detailed in this specification can be implemented as instructions for computing devices, including general purpose processor instructions for a variety of programmable processors, such as microprocessors and systems on a chip (e.g., the Intel Atom, the ARM A8 and Cortex series, the Qualcomm Snapdragon, and the Nvidia Tegra 4). Implementation can also employ a variety of specialized processors, such as graphics processing units (GPUs, such as are included in the Nvidia Tegra series, and the Adreno 530—part of the Qualcomm Snapdragon processor), and digital signal processors (e.g., the Texas Instruments TMS320 and OMAP series devices, and the ultra-low power Qualcomm Hexagon devices, such as the QDSP6V5A), etc. These instructions can be implemented as software, firmware, etc. These instructions can also be implemented in various forms of processor circuitry, including programmable logic devices, field programmable gate arrays (e.g., the Xilinx Virtex series devices), field programmable object arrays, and application specific circuits—including digital, analog and mixed analog/digital circuitry. Execution of the instructions can be distributed among processors and/or made parallel across processors within a device or across a network of devices. Processing of data can also be distributed among different processor and memory devices. References to "processors," "modules" or "components" should be understood to refer to functionality, rather than requiring a particular form of implementation. For example, a "module" that performs a certain function should be understood to encompass one or more items of software, and/or one or more hardware circuits—including an ASIC (i.e., special purpose electronic circuitry that has been custom-designed and manufactured to perform some or all of the component acts, as an application specific integrated circuit).

Software instructions for implementing the detailed functionality can be authored by artisans without undue experimentation from the descriptions provided herein, e.g., written in C, C++, Visual Basic, Java, Python, Tcl, Perl, Scheme, Ruby, etc., in conjunction with associated data.

Software and hardware configuration data/instructions are commonly stored as instructions in one or more data structures conveyed by tangible media, such as magnetic or optical discs, memory cards, ROM, etc., which may be accessed across a network. Some embodiments may be implemented as embedded systems—special purpose computer systems in which operating system software and application software are indistinguishable to the user (e.g., as is commonly the case in basic cell phones). The functionality detailed in this specification can be implemented in operating system software, application software and/or as embedded system software.

Different of the functionality can be implemented on different devices. For example, in a system in which a smartphone communicates with a computer at a remote location, different tasks can be performed exclusively by one device or the other, or execution can be distributed between the devices. Classification of user input as negative or positive sentiment is one example of a process that can be distributed in such fashion. Thus, it should be understood that description of an operation as being performed by a particular device (e.g., a smartphone) is not limiting but exemplary; performance of the operation by another device (e.g., a remote server), or shared between devices, is also expressly contemplated.

In like fashion, description of data being stored on a particular device is also exemplary; data can be stored anywhere: local device, remote device, in the cloud, distributed, etc.

As indicated, the present technology can be used in connection with wearable computing systems, including headworn devices. Such devices typically include one or more sensors (e.g., microphone(s), camera(s), accelerometers(s), etc.), and display technology by which computer information can be viewed by the user—either overlaid on the scene in front of the user (sometimes termed augmented reality), or blocking that scene (sometimes termed virtual reality), or simply in the user's peripheral vision. A headworn device may further include sensors for detecting electrical or magnetic activity from or near the face and scalp, such as EEG and EMG, and myoelectric signals—sometimes termed Brain Computer Interfaces, or BCIs. (A simple example of a BCI is the Mindwave Mobile product by NeuroSky, Inc.) Exemplary wearable technology is detailed in patent documents U.S. Pat. No. 7,397,607, 20100045869, 20090322671, 20090244097 and 20050195128. Commercial offerings, in addition to the Google Glass product, include the Vuzix Smart Glasses M100, Wrap 1200AR, and Star 1200XL systems. An upcoming alternative is augmented reality contact lenses. Such technology is detailed, e.g., in patent document 20090189830 and in Parviz, Augmented Reality in a Contact Lens, IEEE Spectrum, September, 2009. Some or all such devices may communicate, e.g., wirelessly, with other computing devices (carried by the user or otherwise), or they can include self-contained processing capability. Likewise, they may incorporate other features known from existing smart phones and patent documents, including electronic compass, accelerometers, gyroscopes, camera(s), projector(s), GPS, etc.

Repeated references were made to context. The artisan will understand that context refers to any information useful in characterizing the situation of an entity (an entity being a person, place or object that is considered relevant to an interaction between a user and an application, including the user and application themselves).

Context information can be of many sorts, including computing context (network connectivity, resource availability, processor type, CPU contention, etc.), user context (user profile, location, actions, preferences, nearby friends, social network(s) and situation, etc.), physical context (e.g., lighting, noise level, traffic, sensed sounds, recognized speech, etc.), temporal context (time of day, day, month, season, etc.), history of the above, etc.

Another taxonomy of context progresses from simple and concrete, to complex and abstract, starting with location, then physical context (as determined by sensors, e.g., device orientation and motion, temperature, infrared, video, 3D ambient audio, ultrasonic, humidity, gases and other chemical), then user or device actions (e.g., writing, talking, reading, searching, navigating, pointing), then proximities (e.g., to people, vehicles, buildings, perimeters, jurisdictions, other devices), then somatic (e.g., live datastreams of biometric information), then data feeds (e.g., subscriptions and RSS feeds, social network follows, alerts and updates), then emergent live data (e.g., from external sources, such as calls, text, email, weather forecasts), and finally n-dimensional context history—encompassing some or all of the foregoing.

Context arrangements suitable for use with the present technology are further detailed in the documents incorporated by reference.

Reference was made to sensing a user's facial expressions and emotions. Such technology is known to artisans, e.g., as illustrated by patent documents U.S. Pat. Nos. 6,212,502, 7,874,983, 2009112616, 20040001616, 20090002178, 20090118593, 20100037187, 20100086215, 20110301433 and by Tao et al, Affective Computing, A Review, in Affective Computing and Intelligent Interaction, LNCS 3784, Vol. pp. 981-995, 2005. Discerning mental state from sensed cardiac signals is detailed in patent document 20150099987.

Similarly, detection of stress from a user's voice is a well-established science, as shown, e.g., in Lu, et al, Stresssense: Detecting Stress in Unconstrained Acoustic Environments Using Smartphones, Proc. 2012 ACM Conference on Ubiquitous Computing; Chang, et al, How's my mood and stress? An Efficient Speech Analysis Library for Unobtrusive Monitoring on Mobile Phones, Proc. 6th International Conference on Body Area Networks, ICST, 2011; and Muaremi, et al, Towards Measuring Stress with Smartphones and Wearable Devices During Workday and Sleep, BioNanoScience 3.2, pp. 172-183, 2013.

The techniques of digital watermarking are presumed to be familiar to the artisan. Examples are detailed, e.g., in Digimarc's patent documents U.S. Pat. Nos. 6,614,914, 6,590,996, 6,122,403, 20100150434 and 20110274310.

Systems for context/activity sensing using physical sensing elements are detailed in patent documents 20120265716, 20120265717, 20120279304, 20130179110, 20130332108, 20140244209 and 20150127298.

This specification has discussed several different embodiments. It should be understood that the methods, elements and concepts detailed in connection with one embodiment can be combined with the methods, elements and concepts detailed in connection with other embodiments. While some such arrangements have been particularly described, many have not—due to the large number of permutations and combinations. Applicant similarly recognizes and intends that the methods, elements and concepts of this specification can be combined, substituted and interchanged—not just among and between themselves, but also with those known from the cited prior art. Moreover, it will be recognized that the detailed technology can be included with other technologies—current and upcoming—to advantageous effect. Implementation of such combinations is straightforward to the artisan from the teachings provided in this disclosure.

While this disclosure has detailed particular ordering of acts and particular combinations of elements, it will be recognized that other contemplated methods may re-order acts (possibly omitting some and adding others), and other contemplated combinations may omit some elements and add others, etc.

Although disclosed as complete systems, sub-combinations of the detailed arrangements are also separately contemplated (e.g., omitting various of the features of a complete system).

While certain aspects of the technology have been described by reference to illustrative methods, it will be recognized that apparatuses configured to perform the acts of such methods are also contemplated as part of applicant's inventive work. Likewise, other aspects have been described by reference to illustrative apparatus, and the methodology performed by such apparatus is likewise within the scope of the present technology. Still further, tangible computer readable media containing instructions for configuring a processor or other programmable system to perform such methods is also expressly contemplated.

To provide a comprehensive disclosure, while complying with the Patent Act's requirement of conciseness, applicant incorporates-by-reference each of the documents referenced herein. (Such materials are incorporated in their entireties, even if cited above in connection with specific of their teachings.) These references disclose technologies and teachings that applicant intends be incorporated into the arrangements detailed herein, and into which the technologies and teachings presently-detailed be incorporated.

In view of the wide variety of embodiments to which the principles and features discussed above can be applied, it should be apparent that the detailed embodiments are illustrative only, and should not be taken as limiting the scope of the invention.

The invention claimed is:

1. A method for extending the battery life of a phone that includes the acts:
   while the phone is in a sleep state, sensing a physical phenomenon with a sensing element, yielding sensed information;
   while the phone is still in said sleep state, lossily compressing the sensed information, yielding compressed data; and
   waking a processor from the sleep state based on said compressed data;
   wherein said act of lossily compressing includes performing multiplications between a vector of sensed data, and plural rows of matrix coefficients.

2. The method of claim 1 in which the rows of matrix coefficients each represents a pattern, and the compressing further includes determining which of said rows of matrix coefficients represents a pattern most similar to a pattern in said sensed information.

3. The method of claim 2 in which:
   the sensed information comprises a temporal sequence of sensed data values;
   the plural rows of matrix coefficients have an order; and
   the compressed data comprises an integer datum indicating an ordinal position, within said order, of a row of matrix coefficients that represents a pattern most similar to said temporal sequence of sensed data values.

4. A method for extending the battery life of a phone that includes the acts:
   lossily compressing sensed data gathered by the phone, yielding lossily-compressed sensed data;
   caching the lossily-compressed sensed data in a phone memory;
   dividing the cached data into pieces; and
   transmitting different pieces of the cached data to a remote processor using a signaling channel, when the phone is caused to make a wireless transmission for reasons other than to transmit cached data.

5. The method of claim 4 that includes adding new lossily-compressed sensed data to said phone memory during each of 10 consecutive minutes, while the phone is conveyed by a user but is in a sleep state, and not transmitting any of such added data to the remote processor during said 10 consecutive minutes, but rather transmitting certain of said added data at a later time.

6. The method of claim 4 that includes adding new lossily-compressed sensed data to said phone memory during each of 100 consecutive minutes, while the phone is conveyed by a user but is in a sleep state, and not transmitting any of such added data to the remote processor during said 100 consecutive minutes, but rather transmitting certain of said added data at a later time.

7. The method of claim 4 in which said signaling channel is an SMS signaling channel.

8. A mobile device including a battery, a processor and a sensing element, the processor being configured to extend a life of the battery by performing acts including:
   while the device is in a sleep state, sensing a physical phenomenon with the sensing element, yielding sensed information;
   while the device is still in said sleep state, lossily compressing the sensed information, yielding compressed data; and
   waking a processor from the sleep state based on said compressed data;
   wherein the processor is configured to lossily compress the sensed information by performing multiplications between a vector of sensed data, and plural rows of matrix coefficients.

9. The device of claim 8 in which the rows of matrix coefficients each represents a pattern, and the processor is configured to determine which of said rows of matrix coefficients represents a pattern most similar to a pattern in said sensed information.

10. The device of claim 9 in which:
    the sensed information comprises a temporal sequence of sensed data values;
    the plural rows of matrix coefficients have an order; and
    the compressed data comprises an integer datum indicating an ordinal position, within said order, of a row of matrix coefficients that represents a pattern most similar to said temporal sequence of sensed data values.

11. The device of claim 8 in which the sensing element and the processor are on a common silicon substrate.

12. A mobile device including a battery, a memory, a wireless transmitter, a processor and a sensor, the processor being configured to extend a life of the battery by performing acts including:
    lossily compressing sensed data gathered by the sensor, yielding lossily-compressed sensed data;
    caching the lossily-compressed sensed data in the memory;
    dividing the cached data into pieces; and
    transmitting different pieces of the cached data with the wireless transmitter to a remote processor using a signaling channel, when the device is caused to make a wireless transmission for reasons other than to transmit cached data.

13. The device of claim 12 in which the processor is configured to add new lossily-compressed sensed data to the memory during each of 10 consecutive minutes, while the device is conveyed by a user but is in a sleep state, and not transmitting any of such added data to the remote processor during said 10 consecutive minutes, but rather transmitting certain of said added data at a later time.

14. The device of claim 12 in which the processor is configured to add new lossily-compressed sensed data to the memory during each of 100 consecutive minutes, while the device is conveyed by a user but is in a sleep state, and not transmitting any of such added data to the remote processor during said 100 consecutive minutes, but rather transmitting certain of said added data at a later time.

15. The device of claim 12 in which said signaling channel is an SMS signaling channel.

\* \* \* \* \*